United States Patent
Hwang et al.

(10) Patent No.: US 8,482,138 B2
(45) Date of Patent: Jul. 9, 2013

(54) THREE-DIMENSIONAL SEMICONDUCTOR MEMORY DEVICE

(75) Inventors: Sung-Min Hwang, Seoul (KR); Hansoo Kim, Suwon-si (KR); Wonseok Cho, Suwon-si (KR); Jaehoon Jang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 66 days.

(21) Appl. No.: 13/012,485

(22) Filed: Jan. 24, 2011

(65) Prior Publication Data

US 2011/0180941 A1      Jul. 28, 2011

(30) Foreign Application Priority Data

Jan. 22, 2010   (KR) .................. 10-2010-0006124

(51) Int. Cl.
*H01L 29/40*   (2006.01)

(52) U.S. Cl.
USPC .................................. 257/786; 257/E23.141

(58) Field of Classification Search
USPC ................. 257/211, 314, 316, 324, 621, 622,
257/623, 786, E23.141, E27.06, E27.103,
257/E27.112, E27.113, E29.3–E29.307;
438/287, 288; 365/185.05, 72
See application file for complete search history.

(56) References Cited

U.S. PATENT DOCUMENTS

| | | | |
|---|---|---|---|
| 2007/0170589 A1 | 7/2007 | Kato et al. | |
| 2008/0173932 A1 | 7/2008 | Kidoh et al. | |
| 2008/0253183 A1 * | 10/2008 | Mizukami et al. | 365/185.05 |
| 2009/0146206 A1 | 6/2009 | Fukuzumi et al. | |

FOREIGN PATENT DOCUMENTS

| | | |
|---|---|---|
| JP | 06-338602 | 12/1994 |
| JP | 2007-194496 | 8/2007 |
| JP | 2008-171918 | 7/2008 |
| JP | 2008-192857 | 8/2008 |
| JP | 2008-258458 | 10/2008 |
| JP | 2008-263029 | 10/2008 |
| JP | 2009-135324 | 6/2009 |
| KR | 1020070077118 A | 7/2007 |
| KR | 1020080092290 A | 10/2008 |

* cited by examiner

*Primary Examiner* — Tucker Wright
(74) *Attorney, Agent, or Firm* — Myers Bigel Sibley & Sajovec, P.A.

(57) ABSTRACT

Provided is a three-dimensional semiconductor device and method for fabricating the same. The device includes a first electrode structure and a second electrode structure stacked sequentially on a substrate. The first and second electrode structures include stacked first electrodes and stacked second electrodes, respectively. Each of the first and second electrodes includes a horizontal portion parallel with the substrate and an extension portion extending from the horizontal portion along a direction penetrating an upper surface of the substrate. Here, the substrate may be closer to top surfaces of the extension portions of the first electrodes than to the horizontal portion of at least one of the second electrodes.

13 Claims, 51 Drawing Sheets

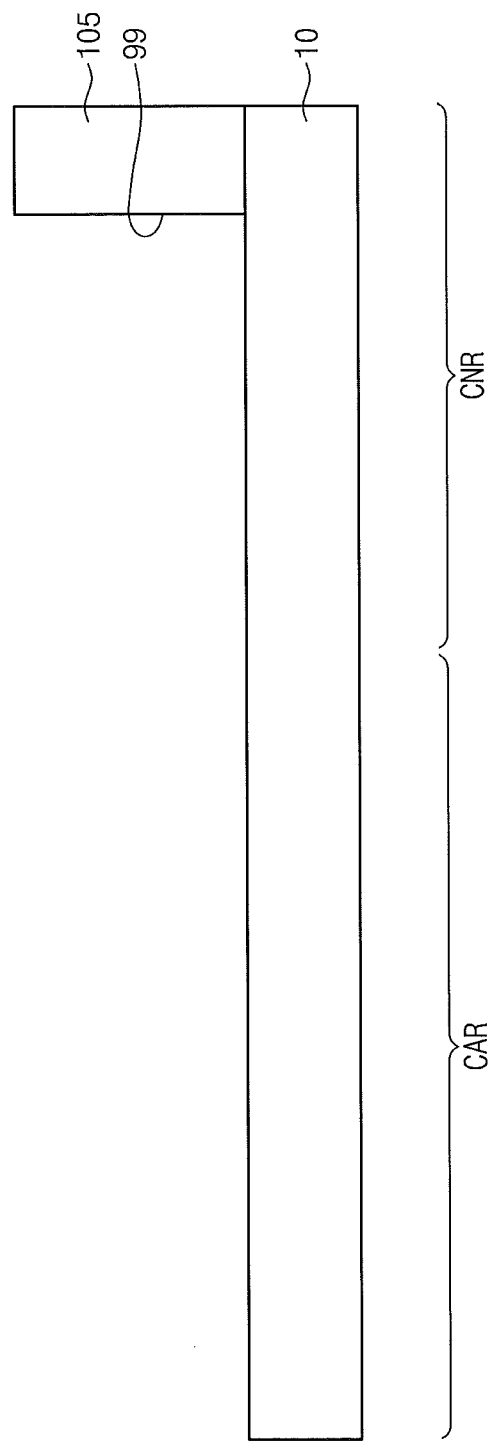

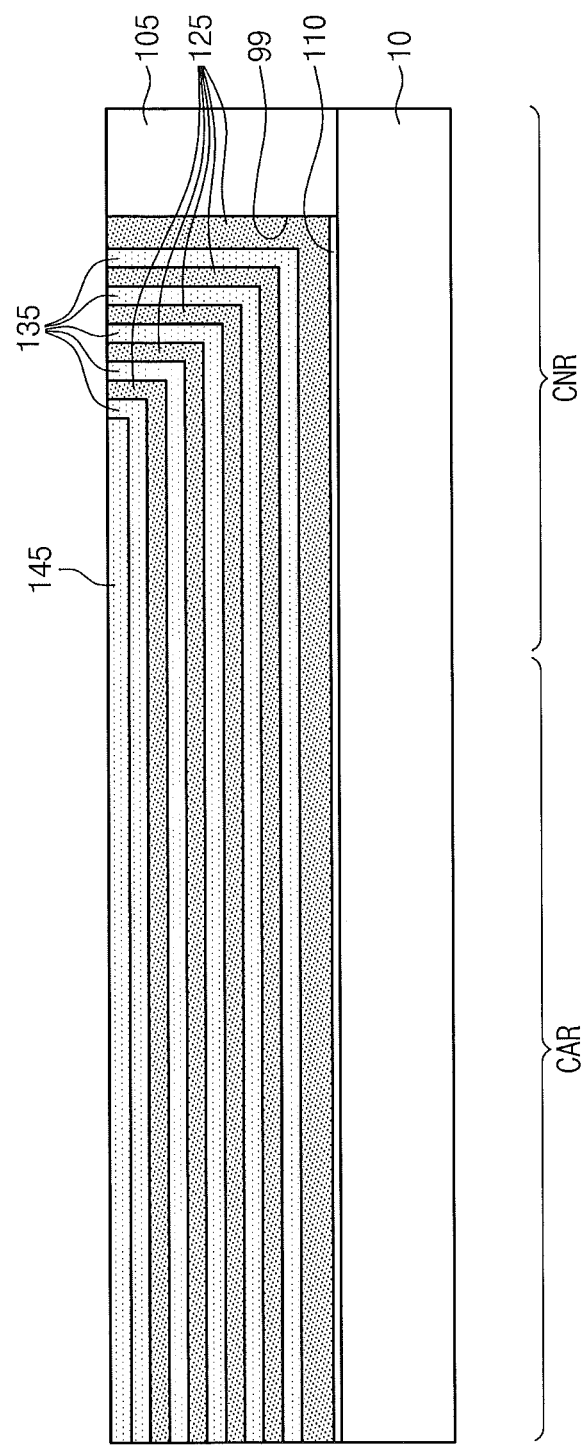

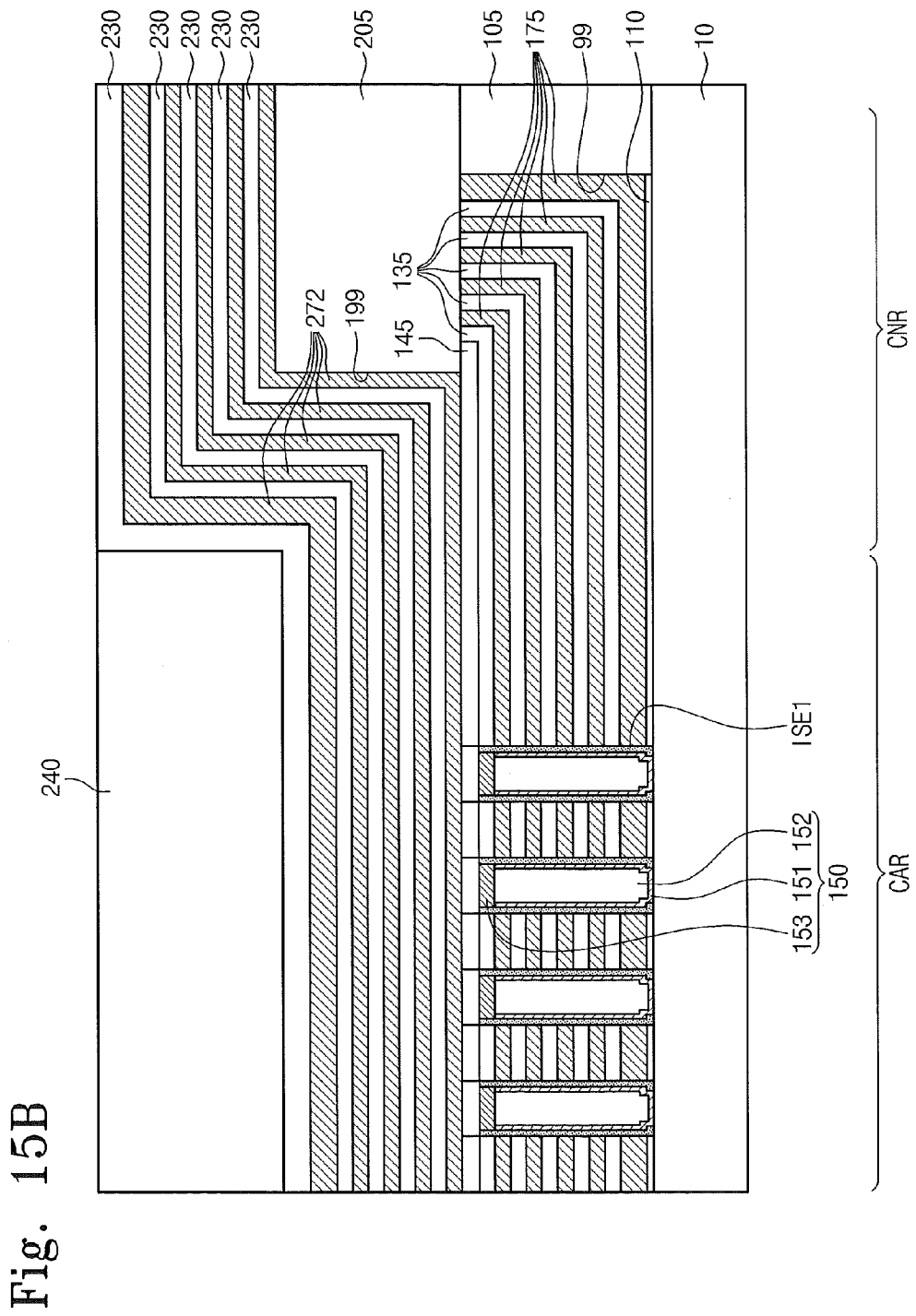

THREE-DIMENSIONAL SEMICONDUCTOR MEMORY DEVICE

CROSS-REFERENCE TO RELATED APPLICATIONS

This U.S. non-provisional patent application claims priority under 35 U.S.C. §119 to Korean Patent Application No. 10-2010-0006124, filed on Jan. 22, 2010, the entire contents of which are hereby incorporated by reference.

BACKGROUND

The present disclosure relates to a three-dimensional (3D) semiconductor devices and methods for fabricating the same.

Three-dimensional integrated circuit (3D-IC) memory technology is a promise toward higher level of memory capacity, and covers various ways related to a three-dimensional arrangement of memory cells. The memory capacity can be increased by pattern miniaturization technology or multi level cell (MLC) technology as well as 3D-IC memory technology. However, because pattern miniaturization technology may require higher fabrication costs and MLC technology is restricted in increasing bits per unit cell, the 3D-IC memory technology may be used for increasing memory capacity. Pattern miniaturization and MLC technologies may be independently developed because memory capacity can be further increased by incorporating these technologies into 3D-IC technology.

A punch-and-plug technology, which includes forming multilayered films on a substrate and then forming a plug through the multilayered films, has been suggested as one of the 3D-IC technologies. Punch-and-plug technology has lately attracted considerable attention because it enables a retrenchment of process steps and manufacturing cost. Especially, even if a layer number of the multilayered films increases, punch-and-plug technology makes it possible to realize a higher memory capacity without a significant increase of manufacturing cost. For all that, if a thickness of the multilayered films increases, it may be difficult to form a hole penetrating the multilayered films and a plug filling the hole.

SUMMARY

Embodiments of the inventive concept provide 3D semiconductor devices having electrodes, which are arranged three-dimensionally.

Embodiments of the inventive concept also provide 3D semiconductor devices having memory cells, which are arranged three-dimensionally.

Embodiments of the inventive concept provide methods of fabricating 3D semiconductor devices.

Embodiments of the inventive concept provide three-dimensional semiconductor devices including: a first electrode structure disposed on a substrate, the first electrode structure having first electrodes which are stacked on the substrate; and a second electrode structure disposed on the first electrode structure, the second electrode structure having second electrodes which are stacked on the first electrode structure, wherein each of the first electrodes and the second electrodes has a horizontal portion parallel with the substrate and an extension portion extending from the horizontal portion, and the extension portion has a major axis through an upper surface of the substrate, the horizontal portions of the first electrode and the second electrode are gradually shortened moving farther away from the substrate, and the substrate is closer to top surfaces of the extension portions of the first electrodes than to at least one horizontal portion of the second electrodes.

In some embodiments, the extension portions of the first electrodes may have top surfaces that are disposed on substantially the same level, the extension portions of the second electrodes may have top surfaces that are formed on substantially the same level, and the extension portions of the first electrodes may be formed on a different level from the extension portions of the second electrodes.

In other embodiments, the devices may further include an interconnection structure having lower plugs, the interconnection structure disposed on the second electrode structure, wherein the lower plugs comprise first plugs that are connected to the first electrodes and second plugs that are shorter than the first plug and connected to the second electrodes.

In still other embodiments, a difference in length between the first plug and the second plug may be substantially the same as the difference in height between the top surfaces of the first and second electrode structures.

In even other embodiments, the interconnection structure may include: lower interconnection lines crossing over the horizontal portions and connected to the first and second plugs; at least one upper plug connected to the lower interconnection line; and at least one upper interconnection line connected to the upper plug.

In yet other embodiments, the lower interconnection lines connected to the first and second plugs may be disposed on substantially the same level.

In further embodiments, the devices may include: first semiconductor patterns arranged two-dimensionally and penetrating the first electrode structure; second semiconductor patterns disposed on the first semiconductor patterns and penetrating the second electrode structure; at least one first information storage element disposed between the first semiconductor patterns and sidewalls of the first electrodes; and at least one second information storage element disposed between the second semiconductor patterns and sidewalls of the second electrodes.

In still further embodiments, the first information storage element may be extended from the sidewall of the first electrode to cover the top surface and the bottom surface of the first electrode.

In even further embodiments, at least one of the first and second information storage elements may cover at least a portion of the top surface of at least one of the first and second electrodes with which the at least one of the first and second information storage elements is in contact.

In yet further embodiments, the vertical distance between horizontal portions may be different from the horizontal distance between extension portions in adjacent first electrodes and/or second electrodes.

In yet further embodiments, the devices may further include: first interlayer molds disposed between the first electrodes; second interlayer molds disposed between the second electrodes; and an insulating spacer disposed on at least one sidewall of the extension portion of at least one of the first and second electrodes.

In yet further embodiments, in at least one of the first and second electrodes, the width of the extension portion may be greater than the thickness of the horizontal portion.

In yet further embodiments, at least one of the extensions of the first and second electrodes may have a major axis that is sloped with respect to the normal line of the top surface of the substrate.

In yet further embodiments, the devices may further include: a first outer mold and a second outer mold which are sequentially stacked on the substrate. A sidewall of the first electrode structure may be defined by the first outer mold, a sidewall of the second electrode structure may be defined by the second outer mold, and the second outer mold may cover the top surfaces of the extension portions of the first electrodes.

Embodiments of the inventive concept provide methods for fabricating a three-dimensional semiconductor device in which the first electrodes and the second electrodes are simultaneously formed in a common fabricating process, which includes a sequence of process steps. The first and second electrodes are formed of substantially the same material.

In some embodiments, the three-dimensional semiconductor device may include: first semiconductor patterns arranged two-dimensionally to penetrate the first electrode structure; second semiconductor patterns respectively disposed on the first semiconductor patterns to penetrate the second electrode structure; at least one first information storage element disposed between the first semiconductor patterns and the sidewalls of the first electrodes; and at least one second information storage element disposed between the second semiconductor patterns and the sidewalls of the second electrodes. The first semiconductor patterns may be formed in a different process step from the second semiconductor patterns.

In other embodiments, the first and second information storage elements are simultaneously formed in a common fabricating process, which includes a sequence of process steps, and the first and second information storage elements are formed of substantially the same material.

In still other embodiments, the forming of the first and second electrode structures may include: sequentially forming a first mold structure defining first recess regions and a second mold structure defining second recess regions on the first mold structure; and simultaneously forming the first electrodes and the second electrodes which are disposed in the first recess regions and the second recess regions, respectively. The first and second electrodes are formed of substantially the same material.

In even other embodiments, the methods may further include forming a first outer mold and a second outer mold, which are sequentially stacked on the substrate. The sidewalls of the first and second electrode structures may be respectively defined by the first and second outer molds, and the second outer mold may cover top surfaces of the extension portions of the first electrodes.

In yet other embodiments, the forming of the first electrode structure may include forming a first layered structure, which includes sequentially and alternately stacked first interlayer mold layers and first sacrificial layers. The first interlayer mold layers and the first sacrificial layers may have extension portions, which are defined by the outer mold. The forming of the first layered structure may include forming at least one spacer, which is disposed between the extension portions of the first interlayer mold layers.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures:

FIGS. 1a through 10a are perspective views illustrating a method for fabricating a three-dimensional semiconductor device according to a first embodiment of the inventive concept;

FIGS. 1b through 10b are cross-sectional views illustrating a method for fabricating a three-dimensional semiconductor device according to the first embodiment of the inventive concept;

FIGS. 12a through 19a are perspective views illustrating a method for fabricating a three-dimensional semiconductor device according to a second embodiment of the inventive concept;

FIGS. 12b through 19b are cross-sectional views illustrating a method for fabricating a three-dimensional semiconductor device according to the second embodiment of the inventive concept;

DETAILED DESCRIPTION OF THE EMBODIMENTS

Figure 1A:
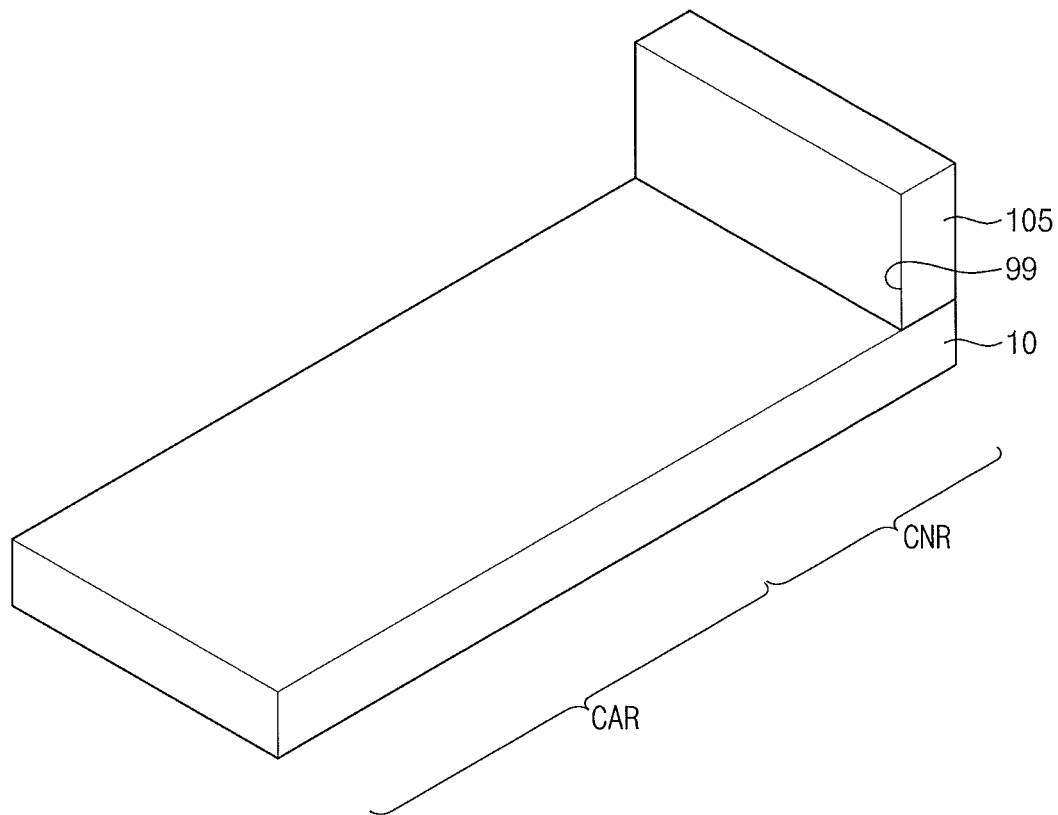

Exemplary embodiments of the inventive concept will be described below in more detail with reference to the accompanying drawings. The embodiments of the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout the description.

It will also be understood herein that when a layer such as a conductive layer, a semiconductor layer or an insulating layer is referred to as being "on" another layer or substrate, the layer may be directly on the another layer or substrate, or intervening layers may also be present. It will also be understood that, although the terms such as a first, a second, a third, etc. may be used herein to describe layers or processes, the layers or processes should not be limited by these terms. These terms are only used to distinguish one layer or process from another layer or process.

All terms used herein are to describe the inventive concept that should not be limited by these terms. As used herein, the singular forms are intended to include the plural forms as well, unless the context clearly indicates otherwise. It also will be understood that, as used herein, the term "comprises" and/or "comprising" is open-ended, and includes one or more stated constituents, steps, actions and/or elements without precluding one or more unstated constituents, steps, actions and/or elements.

Furthermore, embodiments in the detailed description will be described with sectional views and/or plan views as ideal exemplary views of the inventive concept. In the drawings, the dimensions of layers and regions are exaggerated for clarity of illustration. Thus, the exemplary views may be modified according to manufacturing technology and/or allowable error. Therefore, the embodiments of the present invention are not limited to the specific shape illustrated in the exemplary views, but may include other shapes that may be created according to manufacturing processes. For example, an etched region described with right angles may be rounded or be configured with a predetermined curvature. Thus, the regions illustrated in figures are schematic, and shapes of the regions illustrated in figures exemplifies particular shapes of device regions, but do not limit the scope of the inventive concept.

Hereinafter, exemplary embodiments of the inventive concept will be described in detail with reference to the accompanying drawings.

Embodiment 1

FIGS. 1a through 10a are perspective views illustrating a method for fabricating a three-dimensional semiconductor device according to a first embodiment of the inventive concept, and FIGS. 1b through 10b are cross-sectional views illustrating a method for fabricating a three-dimensional semiconductor device according to the first embodiment (embodiment 1) of the inventive concept.

Referring to FIGS. 1a and 1b, a first outer mold 105 is formed on a substrate 10 to define a first trench 99. The substrate 10 may include a cell array region CAR where memory cells are disposed, a peripheral region where driving circuits for driving the memory cells are disposed, and a connection region CNR where interconnection structures for connecting the memory cells and the driving circuits are disposed. The first outer mold 105 may be formed in the confines of the connection region or the connection region and the peripheral region.

In accordance with various embodiments, the substrate 10 may be at least one material with a semiconductor characteristic, such as, but not limited to, a silicon wafer. Alternatively, the substrate 10 may be one of an insulating material (such as a ceramic, a plastic and a glass) and a semiconductor material or a conductor material covered by an insulating material.

The first outer mold 105 may be formed on the substrate by an additional process. In this case, the first outer mold 105 may be formed of a different material from the substrate 10. For example, if the substrate is formed of silicon, the first outer mold 105 may be formed of silicon oxide that is formed in deposition or a thermal oxidation process. Alternatively, the first outer mold 105 may be formed by patterning the substrate 10, thereby forming the first outer mold 105 and the substrate of the same material. The outer mold 105 may be formed into a multilayered structure including a plurality of layers.

The forming of the driving circuits may include forming device isolation patterns, which define active regions in the peripheral region. The device isolation pattern may be formed by a shallow trench isolation method. The forming of the device isolation pattern may be used to form the first outer mold 105.

Figure 2A:
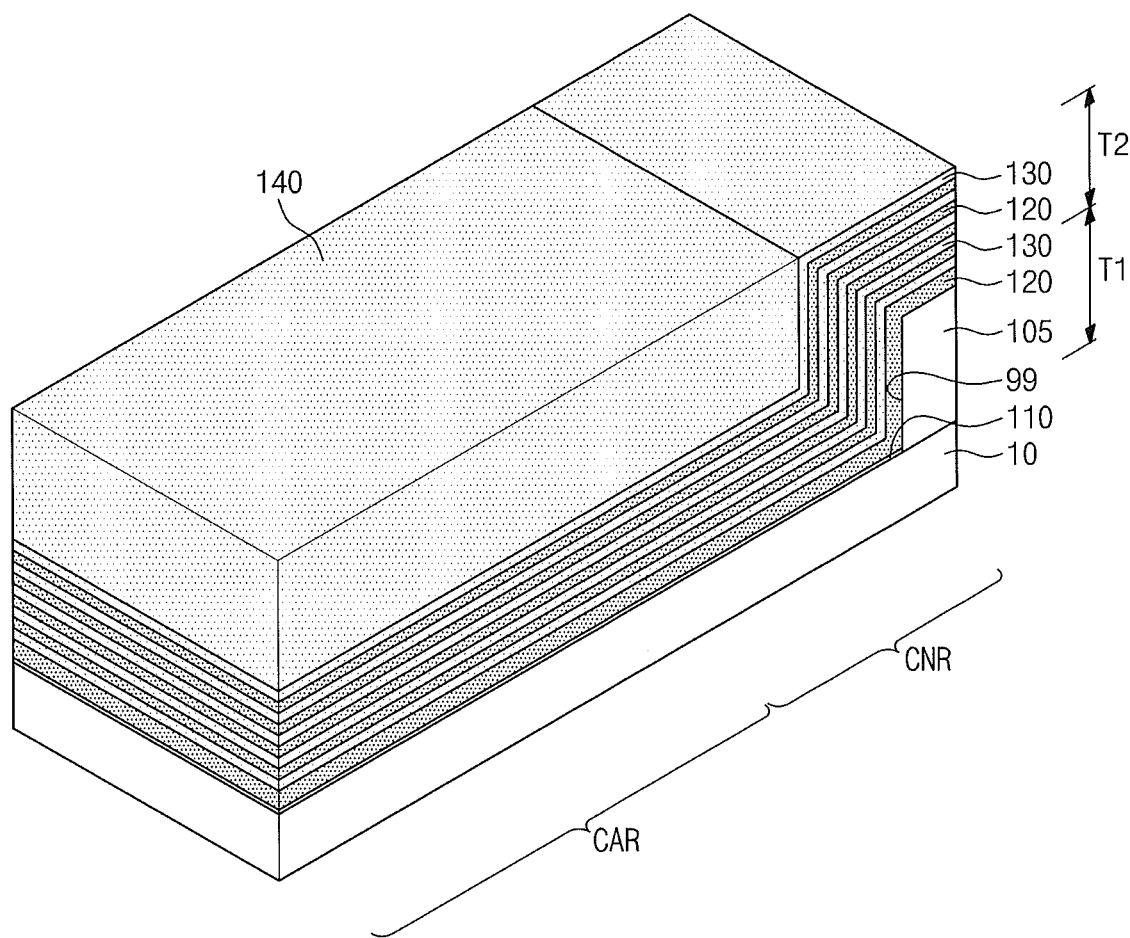
Figure 2B:
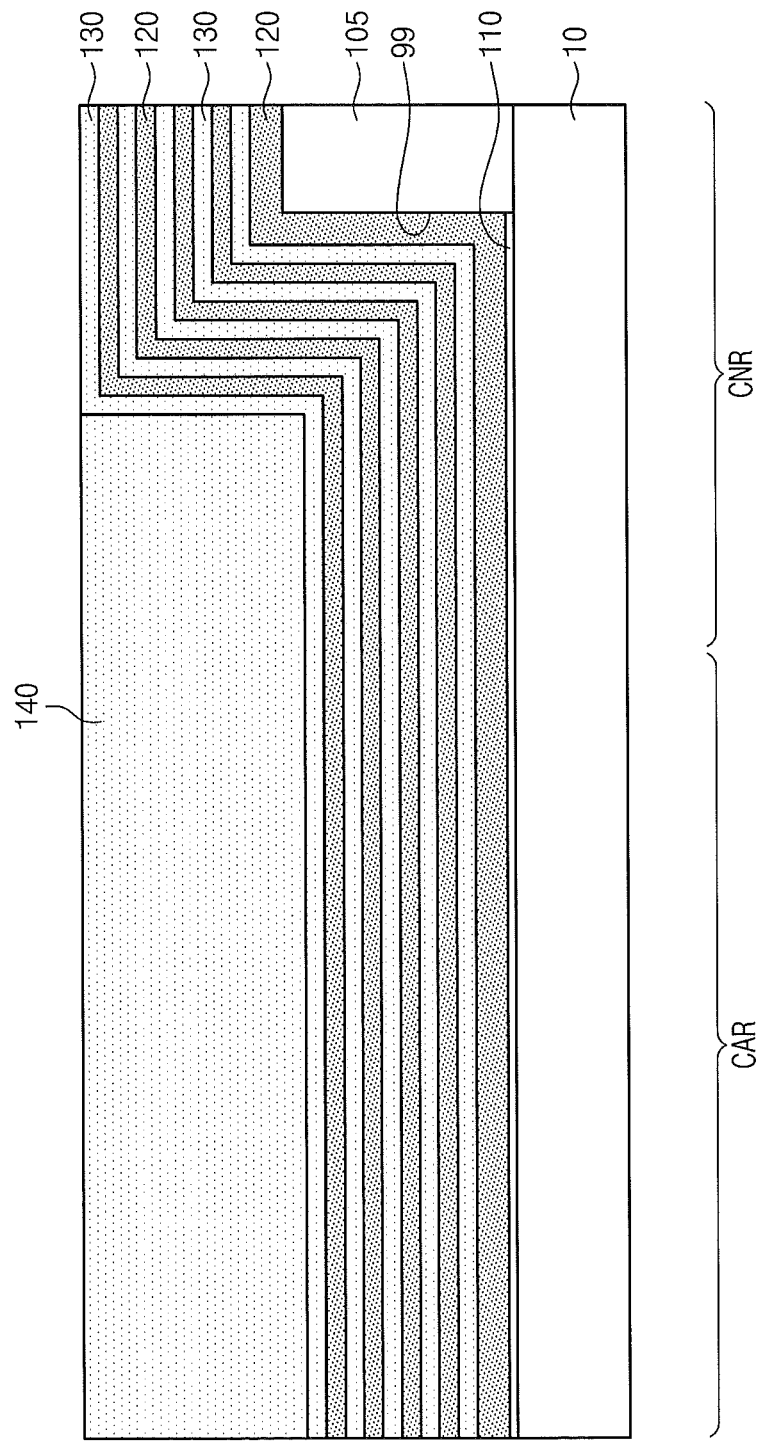

Referring to FIGS. 2a and 2b, a first layered structure is formed on the resultant structure where the outer mold 105 is formed. The first layered structure may include first interlayer mold layers 130 and first sacrificial layers 120, which are sequentially and alternately stacked up.

The first sacrificial layers 120 may be formed of a material having an etch selectivity to the first interlayer mold layers 130. Thus, in the etching of the first sacrificial layers 120, the first sacrificial layers 120 may be etched while reducing or minimizing the etching of the first interlayer mold layers 130. The etch selectivity may be expressed as a quantitative ratio of an etch rate for the first sacrificial layer 120 to an etch rate for the first interlayer mold layer 130. According to an embodiment of the inventive concept, the etch selectivity of the first sacrificial layer 120 to the first interlayer mold layer 130 may be a ratio of ten to one (10:1) through two hundred to one (200:1), more specifically a ratio of thirty to one (30:1) through one hundred to one (100:1). For example, the first interlayer mold layer 130 may be formed of a silicon oxide layer and the first sacrificial layer 120 may be formed of a silicon nitride layer.

According to an embodiment of the inventive concept, the first sacrificial layer 120 and the first interlayer mold layer 130 may be formed to cover conformally the resultant structure where the first outer mold 105 is formed. For example, the first sacrificial layer 120 and the first interlayer mold layer 130 may be formed by at least one of the methods that are capable of providing superior step coverage, for example chemical vapor deposition or atomic layer deposition. In this case, as shown in FIGS. 2a and 2b, the first sacrificial layers 120 and the first interlayer mold layers 130 may have substantially the same thickness to cover a bottom surface of the first trench 99, i.e., an upper surface of the substrate 10, a sidewall of the first trench 99 and an upper surface of the outer mold 105.

According to an embodiment of the inventive concept, the thickness T1 of the first outer mold 105 may be thicker than the deposition thickness T2 of the first layered structure. In some regions, for example on the cell array region CAR, the first layered structure may have a top surface below the top surface of the first outer mold 105.

According to an embodiment of the inventive concept, before forming the first layered structure, a buffer layer 110 may be further formed. The buffer layer 110 may be a silicon oxide layer that is formed by thermal oxidation technology. In this case, the buffer layer 110 may be formed to cover the substrate 10 that is exposed by the first outer mold 105. Alternatively, the buffer 110 may formed by deposition technology in the same way as layers of the first layered structure.

In addition, a first planarization layer 140 may be formed on the resultant structure where the first layered structure is formed. The planarization layer 140 may be formed of at least one material that has an etch selectivity to the first sacrificial layers 120.

Figure 3A:
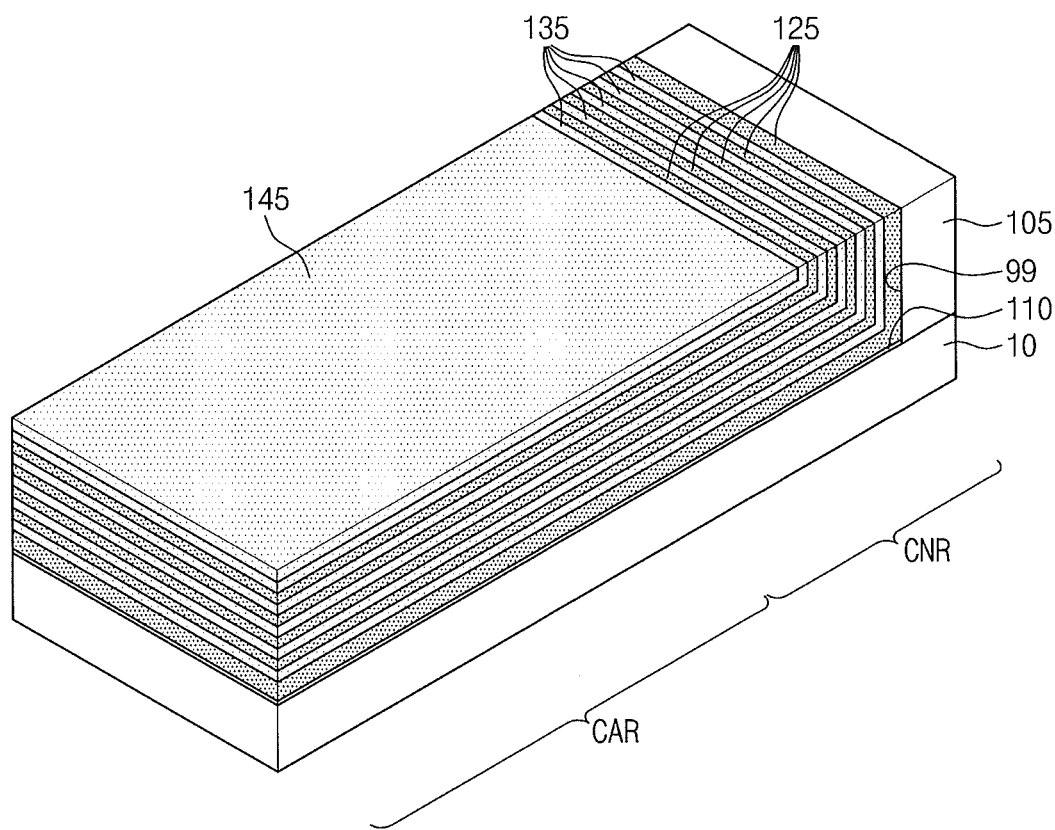

Referring to FIGS. 3a and 3b, the first layered structure is planarized to form a first structure. The planarization process may be performed to expose the top surface of the first outer mold 105. In this case, the first structure may include first sacrificial patterns 125 and first interlayer molds 135, which alternately and sequentially fill the first trench 99. The first planarization layer 140 is used to improve flatness in the planarization process. As a result of the planarization process, a first planarized pattern 145 remains on the first trench 99.

Each of the first sacrificial patterns 125 and the first interlayer molds 135 may have a horizontal portion parallel with the top surface of the substrate 10 and an extension portion parallel with the sidewall of the first trench 99. As a result of the planarization process, the extension portions of the first sacrificial patterns 125 and the first interlayer molds 135 may have top surfaces which are exposed at substantially the same level from the substrate 10. That is, the first structure may be formed of substantially the same thickness as the first outer mold 105.

Figure 4A:
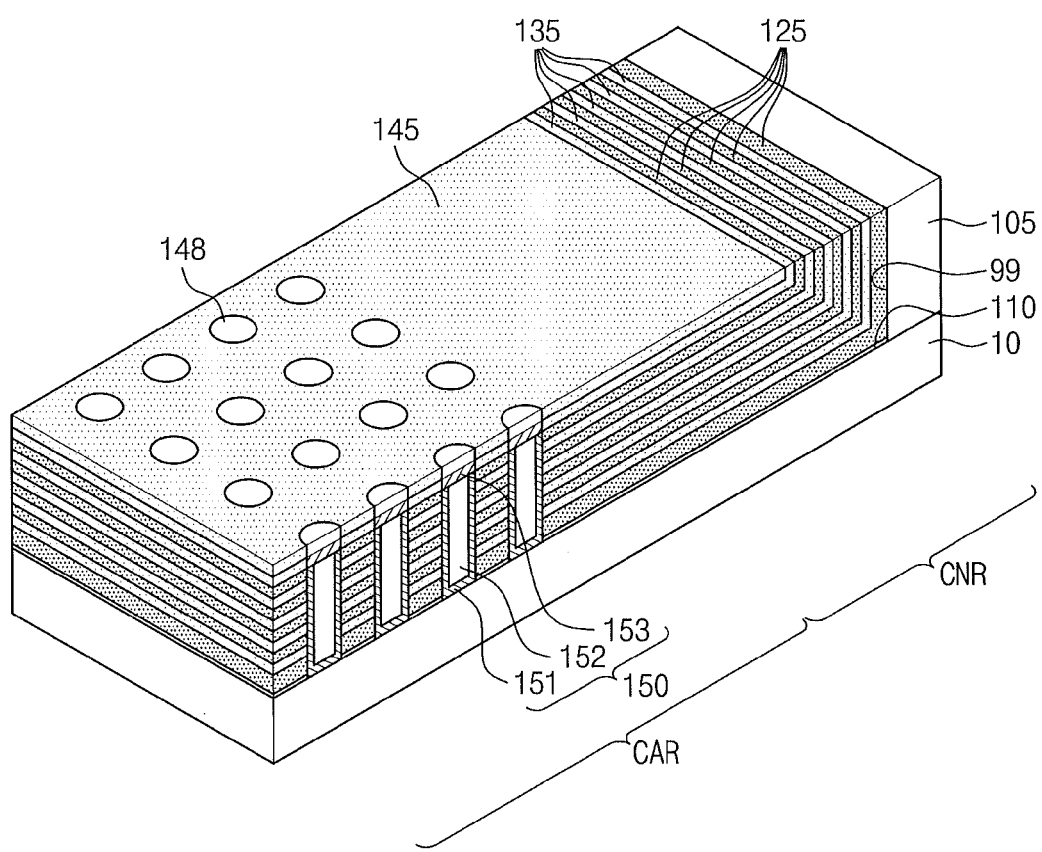
Figure 4B:
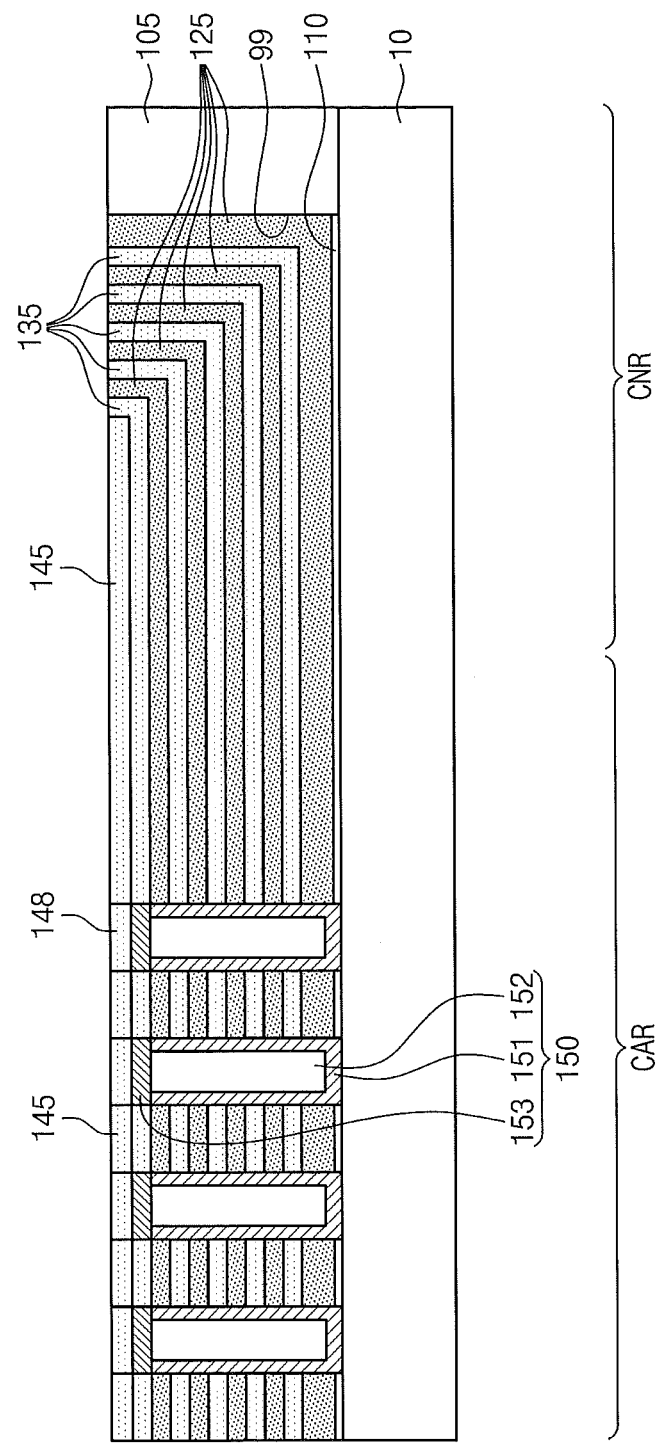

Referring to FIGS. 4a and 4b, after forming first through holes, which penetrate the first structure, first channel structures 150 may be formed to fill the first through holes. The first through holes may be two-dimensionally formed into the top surface of the substrate 10, i.e., xy plane.

The first channel structure 150 may include a first semiconductor pattern 151, which covers the bottom and the sidewall of the first through hole. The first semiconductor pattern 151 does not completely fill the first through hole. In this case, a first semiconductor pad 153 may be further formed on the first semiconductor pattern 151, and a first buried insulating pattern 152 may be further formed in a portion of the through hole, which is confined by the first semiconductor pattern 151 and the first semiconductor pad 153. Alternatively, the first semiconductor pattern 151 may be formed to fill the first through hole completely.

The first semiconductor pattern 151 may be formed of poly crystalline semiconductor, e.g., polysilicon, which may be formed by chemical vapor deposition. Alternatively, the first semiconductor pattern 151 may be a mono-crystalline silicon layer, an organic semiconductor layer and carbon nano structure, and formed by at least one of chemical vapor deposition and an epitaxial process.

The first buried insulating pattern 152 may be formed to fill the first through hole where the first semiconductor pattern 151 is formed. In addition, the first buried insulating pattern 152 may further include at least one insulating material; for example, it may be made of a silicon oxide layer or one of the insulating materials formed by spin on glass (SOG) technology. Alternatively, before forming the first buried insulating patterns 152, a hydrogen annealing step may be further performed on the resultant structure on which the first semiconductor pattern 151 is formed. The hydrogen annealing step treats thermally the resultant structure in a gas atmosphere including hydrogen or heavyhydrogen. The hydrogen annealing step may cure defects in the first semiconductor pattern 151.

The first semiconductor pad 153 may be formed of semiconductor material that is different from the first semiconductor pattern 151 in at least one of conductivity type and impurity concentration. For example, the first semiconductor pattern 151 may be p-type or intrinsic semiconductor and the first semiconductor pad 153 may be n+ type semiconductor.

According to an embodiment of the inventive concept, as shown in FIG. 4b, an upper buried pattern 148 may be formed to fill an upper region of the first through hole above the first channel structure 150.

Figure 5A:
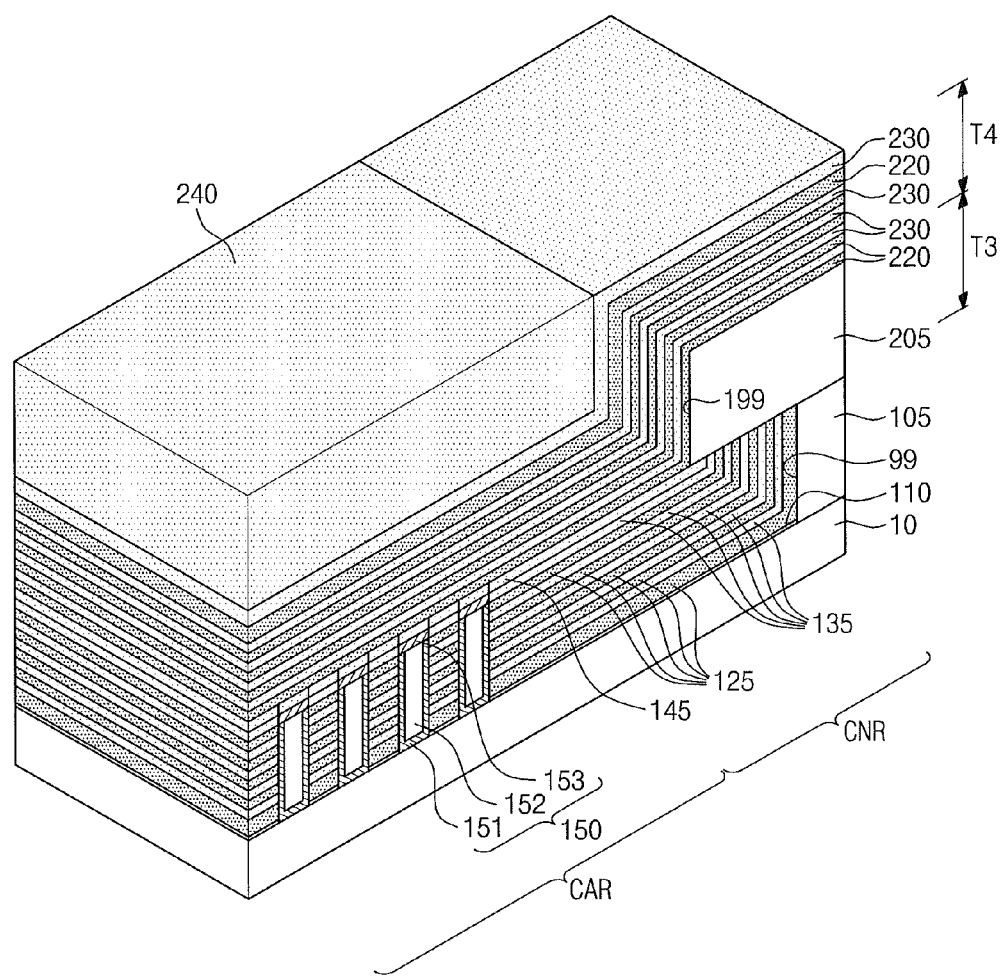
Figure 5B:
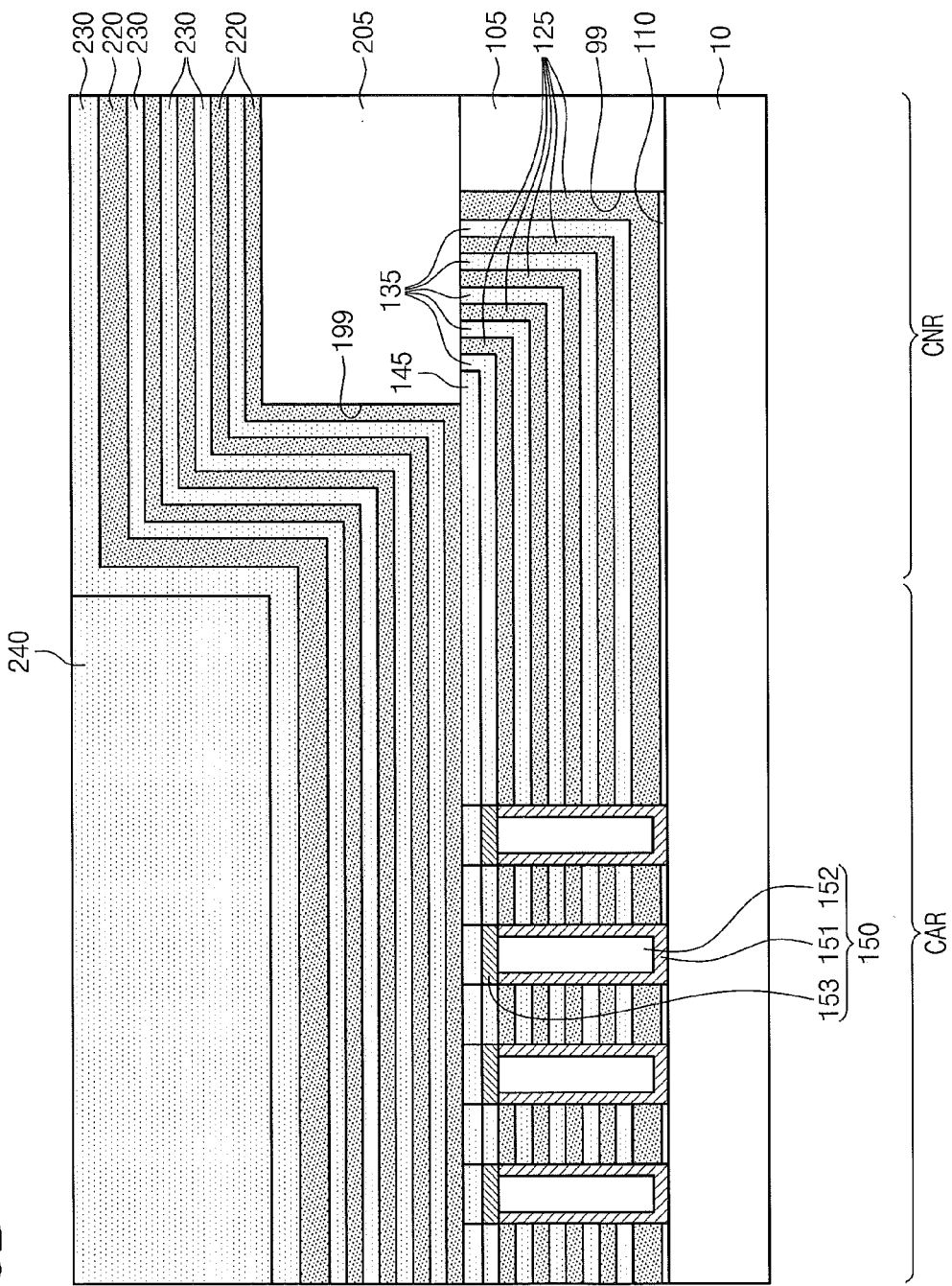

Referring to FIGS. 5a and 5b, a second outer mold 205 defining a second trench 199 and a second layered structure are formed on the resultant structure where the upper buried pattern 148 is formed. The second layered structure may include second sacrificial layers 220 and second interlayer mold layers 230, which are alternatively stack up to cover the second outer mold 205.

The second sacrificial layers 220 may be formed of material having an etch selectivity with respect to the second interlayer mold layer 230. According to an embodiment, the second sacrificial layer 220 may be formed of substantially the same material as the first sacrificial layer 120 and the second interlayer mold layer 230 may be formed of substantially the same material as the first interlayer mold layer 130. For example, the first and second interlayer mold layers 130 and 230 may be formed of silicon oxide and the first and second sacrificial layers 120 and 220 may be formed of silicon nitride. The second outer mold 205 may be formed of a material having an etch selectivity with respect to the first sacrificial pattern 125 and the second sacrificial layer 220. The second outer mold 205 may be formed of a silicon oxide layer.

According to an embodiment of the inventive concept, the second sacrificial layer 220 and the second interlayer mold layer 230 may be, similar to the first sacrificial layer 120 and the first interlayer mold 130, formed by a deposition process that provides superior step coverage. For example, the second sacrificial layer 220 and the second interlayer mold layer 230 may be formed by CVD or ALD methods. Similar to the relation in thickness between the first outer mold 105 and the first layered structure, the thickness T3 of the second outer mold 205 may be thicker than the deposition thickness T4 of the second layered structure. In this case, in some regions (for example on the cell array region CAR), the second layered structure may have a top surface below the top surface of the second outer mold 205.

A second planarization layer 240 may be formed to cover the resultant structure where the second layered structure is formed. The second planarization layer 240 may be formed of a material having an etch selectivity with respect to the second sacrificial layer 220.

Figure 6A:
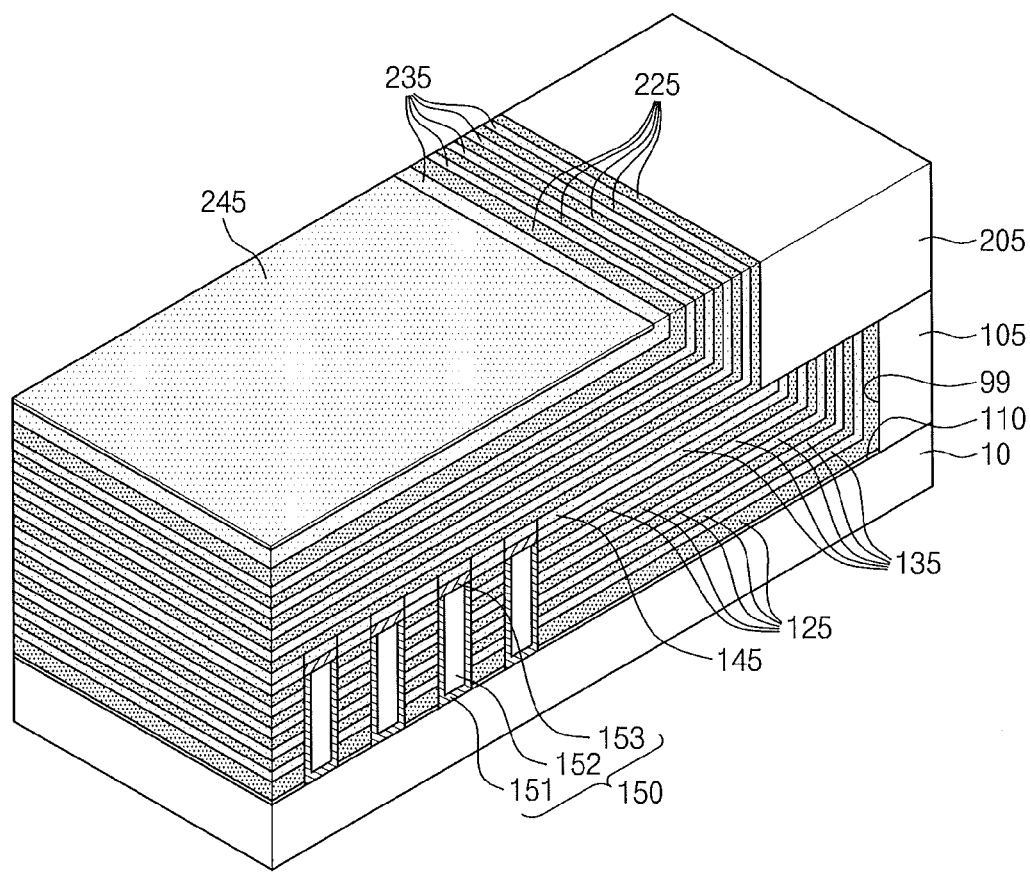
Figure 6B:
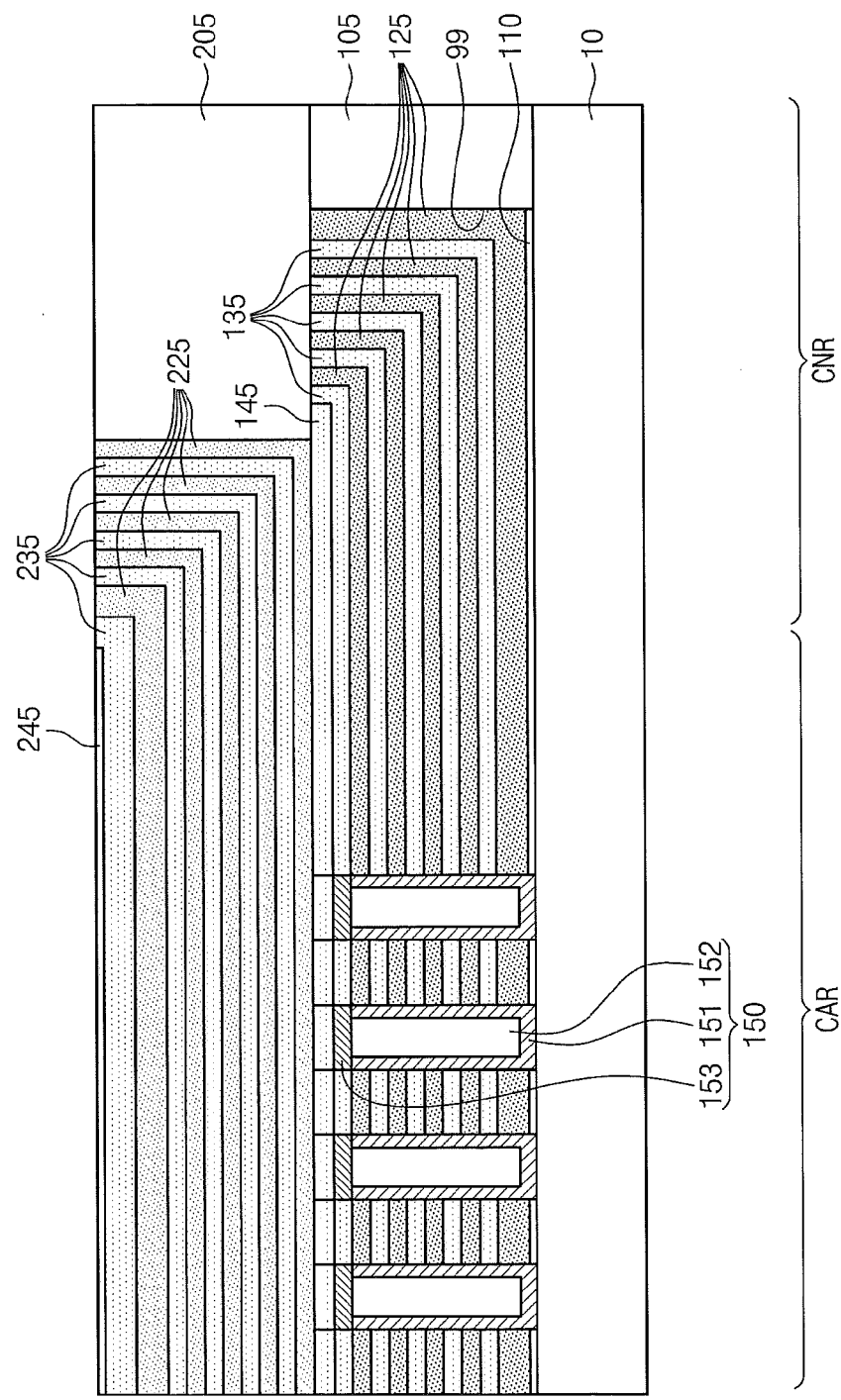

Referring to FIGS. 6a and 6b, the second layered structure is planarized to form a second structure. The planarization process of the second layered structure may be formed to expose the top surface of the second outer mold 205. The second structure may include second sacrificial patterns 225 and second interlayer molds 235, which fill sequentially and alternately the second trench 199. The second planarization layer 240 may be used to improve flatness in the planarization process. As a result of the planarization process, the second planarization layer 240 remains as a second planarized pattern 245 on the second trench 199.

Similar to the first structure, each of the second sacrificial patterns 225 and the second interlayer molds 235 may have a horizontal portion parallel with the top surface of the substrate 10 and an extension portion parallel with the sidewall of the second trench 199. As a result of the planarization process, the extension portions of the second sacrificial pattern 225 and the second interlayer mold 236 may have top surfaces, which are exposed at substantially the same level from the top surface of the substrate 10. Thus, the second structure may be formed of substantially the same thickness as the second outer mold 205.

However, the extension portion of the second structure may be more adjacent than the extension portion of the first structure to the cell array region CAR, and the top surface of the second structure may be farther away than the top surface of the first structure from the top surface of the substrate 10.

Figure 7A:
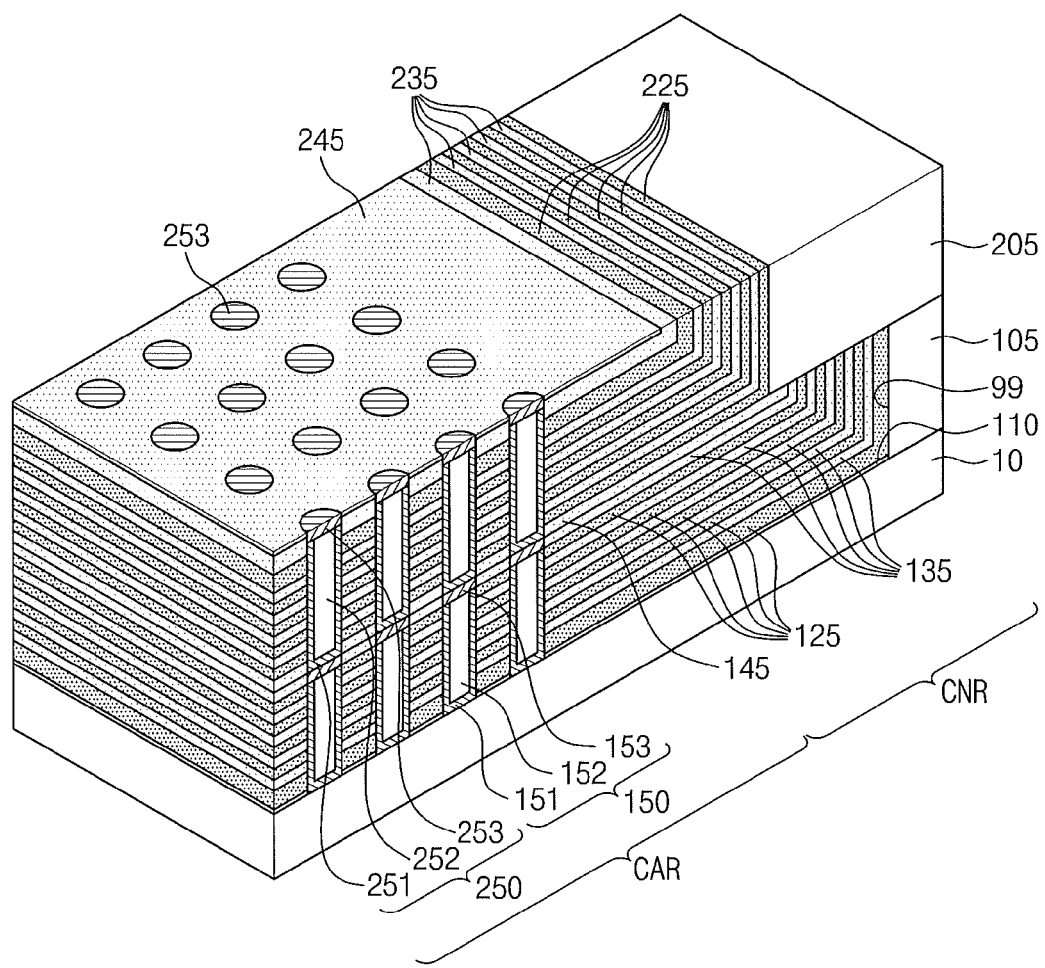
Figure 7B:
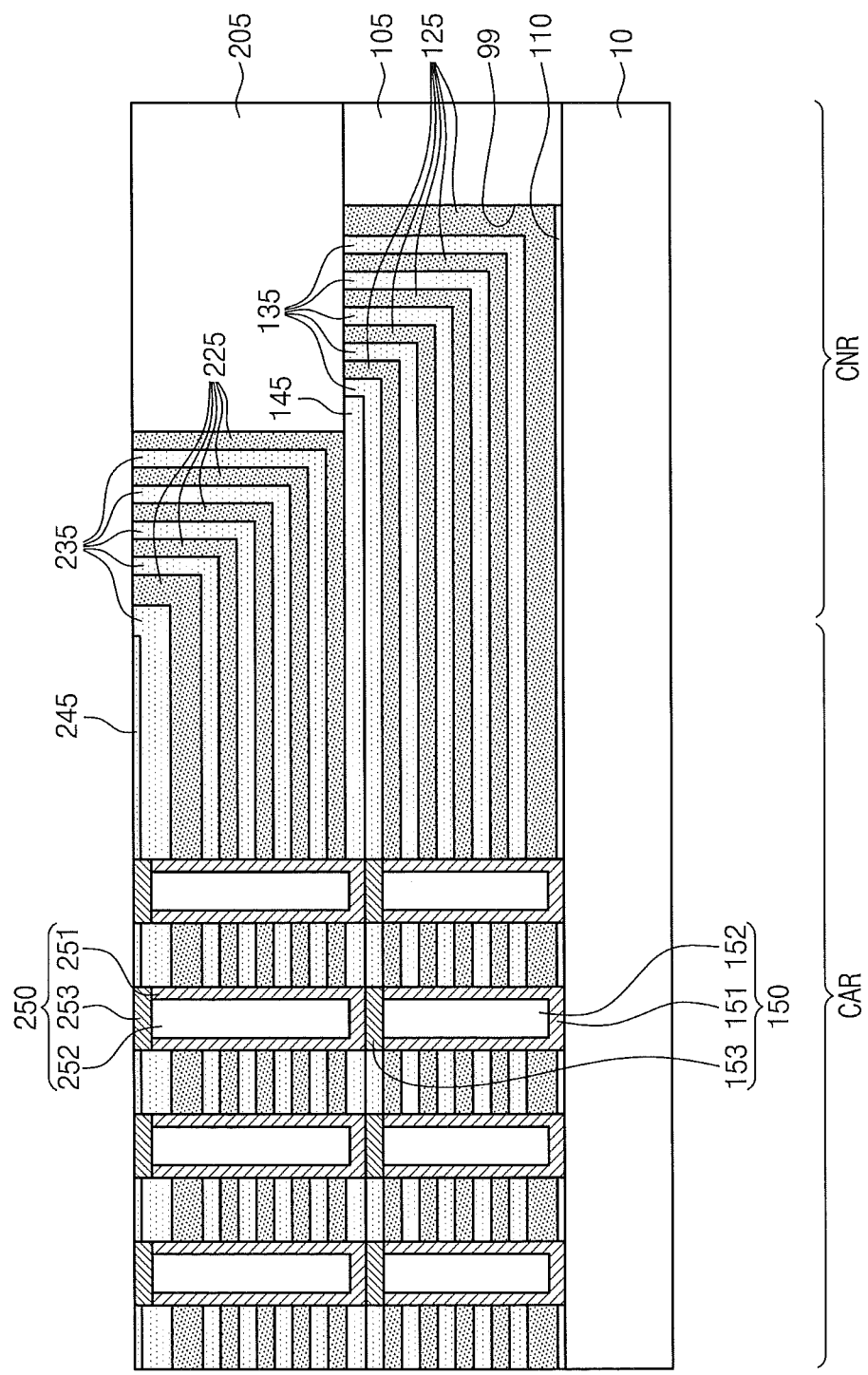

Referring to FIGS. 7a and 7b, after forming second through holes penetrating the second structure, second channel structures 250 are formed to fill the second through holes, respectively. According to an embodiment, the second through holes may be formed to expose the top surface of the first channel structures 150, respectively. Thus, the second through holes may be two-dimensionally formed on the substrate 10, similar with the first channel structures 150.

Each of the second channel structures 250 may include a second semiconductor pattern 251 which cover a bottom and a sidewall of the second through hole. According to an embodiment, the second semiconductor pattern 251 may be formed so as not to completely fill the second through hole. In this case, a second semiconductor pad 253 may be formed in the second through hole above the second semiconductor pattern 251, and a second buried insulating pattern 252 may be formed in the second through hole confined between the second semiconductor pattern 251 and the second semiconductor pad 253.

According to an embodiment, the second semiconductor pattern 251, the second buried insulating pattern 252 and the second semiconductor pad 253 may be formed of substantially the same material and by substantially the same method as the first semiconductor pattern 151, the first buried insulating pattern 152 and the first semiconductor pad 153 of FIGS. 4a and 4b. Alternatively, the second channel structure 250 may be formed of a distinct material by a distinct method from the first channel structure.

Figure 8A:
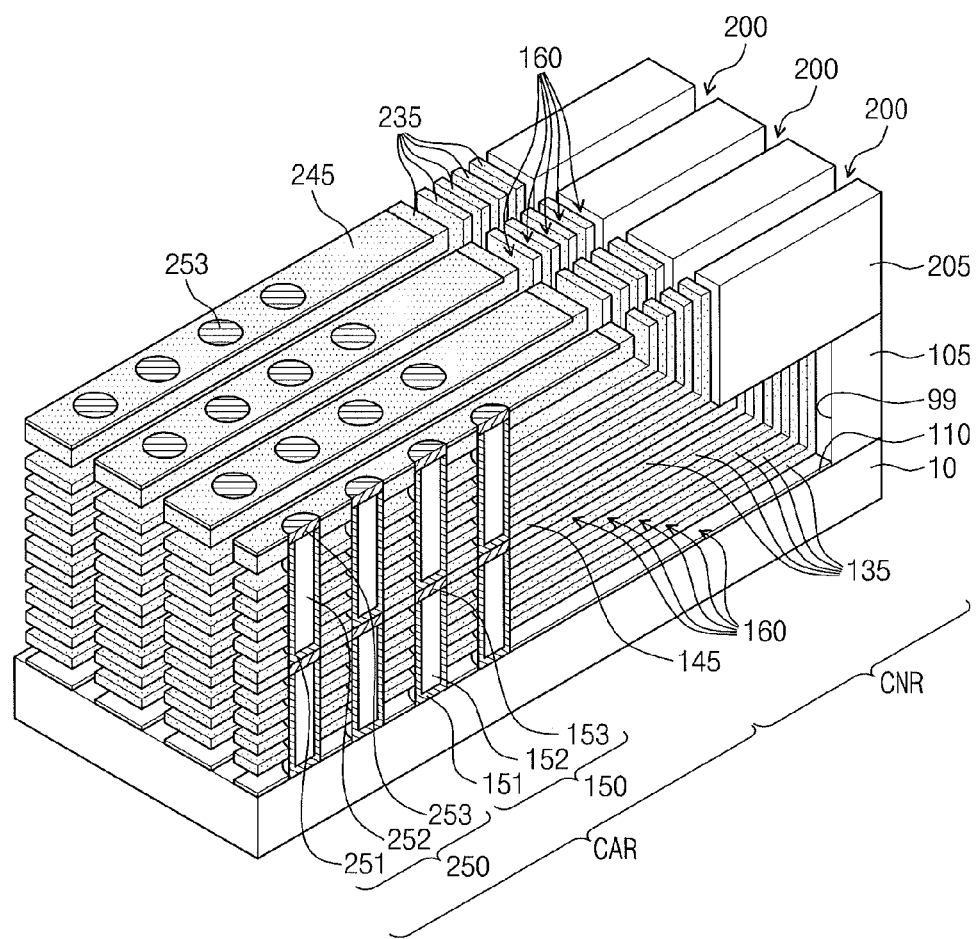
Figure 8B:
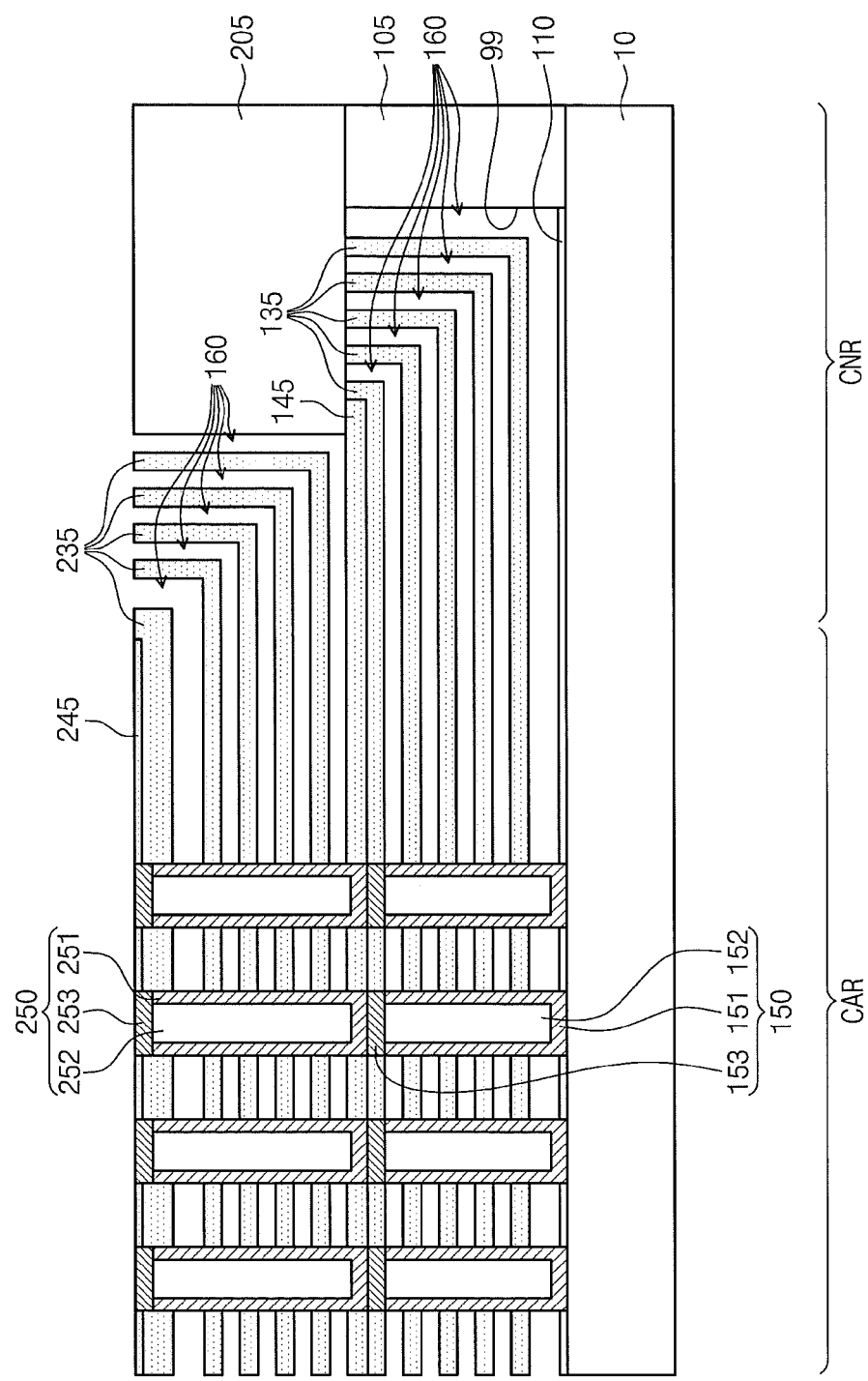

Referring to FIGS. 8a and 8b, the first and second structures may be patterned to form electrode separating regions 200 where the top surface of the substrate 10 is exposed. The electrode separating regions 200 may be formed to be away from the sidewalls of the first and second structures 150 and 250, and extend between the first and second channel structures 150 and 250. Thus, the first and second sacrificial patterns 125 and 225, and the first and second interlayer molds 135 and 235 have sidewalls that are exposed by the electrode separating region 200. In addition, the electrode separating region 200 may be formed to laterally separate the first and second outer molds 105 and 205.

Subsequently, the first and second sacrificial patterns 125 and 225 exposed by the electrode separating regions 200 are selectively and laterally etched to form recess regions 160 between the first and second interlayer molds 135 and 235. The recess region 160 may be a gap region, which laterally extends from the electrode separating region 200 and between the first and second molds 135 and 235. Thus, the boundary of the recess region 160 may be defined by the top/bottom surfaces of the first and second molds 135 and 235, sidewalls of the first and second semiconductor pattern 151 and 251, and the electrode separating regions 200.

The forming of the recess regions 160 may include laterally etching the first and second sacrificial patterns 125 and 225 using an etching recipe that has an etch selectivity on the first and second sacrificial patterns 125 and 225 with respect to the first and second interlayer molds 135 and 235 and the first and second semiconductor patterns 151 and 251. For example, if the first and second sacrificial patterns 125 and 225 are silicon nitride layers and the first and second interlayer molds 135 and 235 are silicon oxide layers, the etch process may be performed using an etchant including phosphoric acid.

Because the recess regions 160 are formed by etching the first and second sacrificial patterns 125 and 225 laterally, the recess regions 160 can have horizontal portions parallel with the top surface of the substrate 10 and extension portions parallel with the sidewall of the first and second trenches 99 and 199.

Figure 9A:
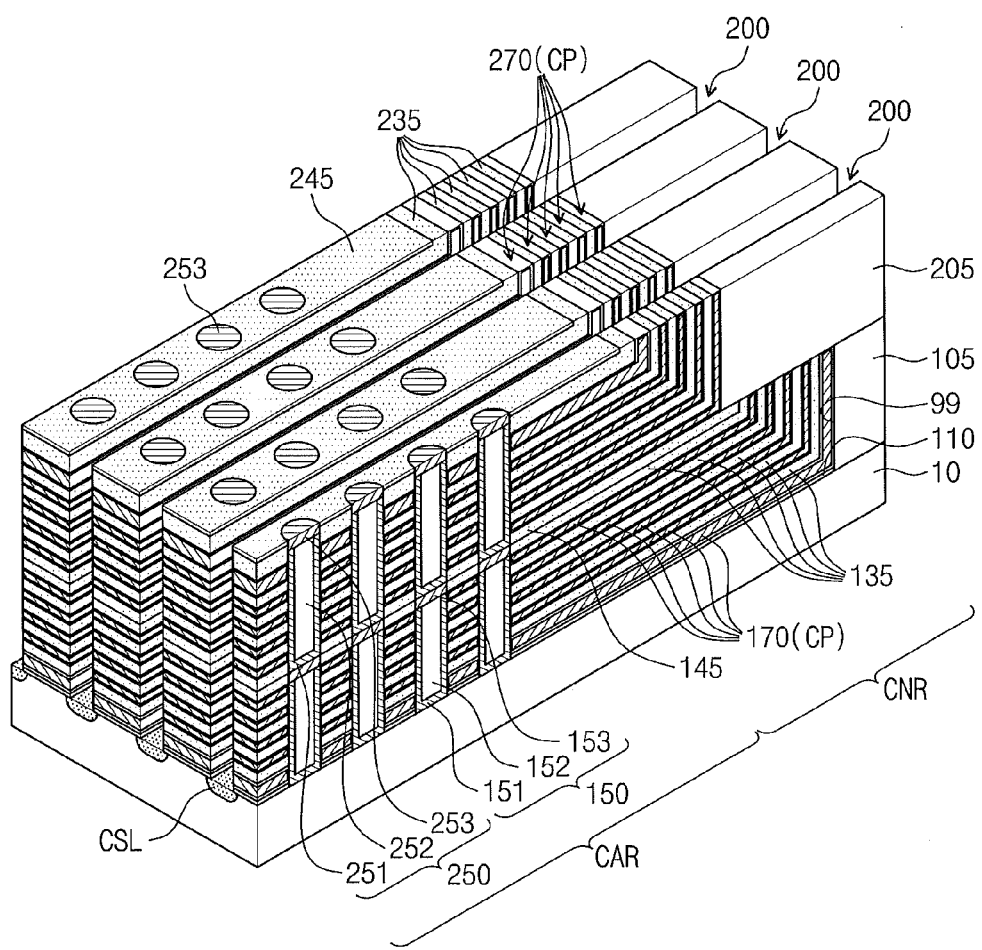
Figure 9B:
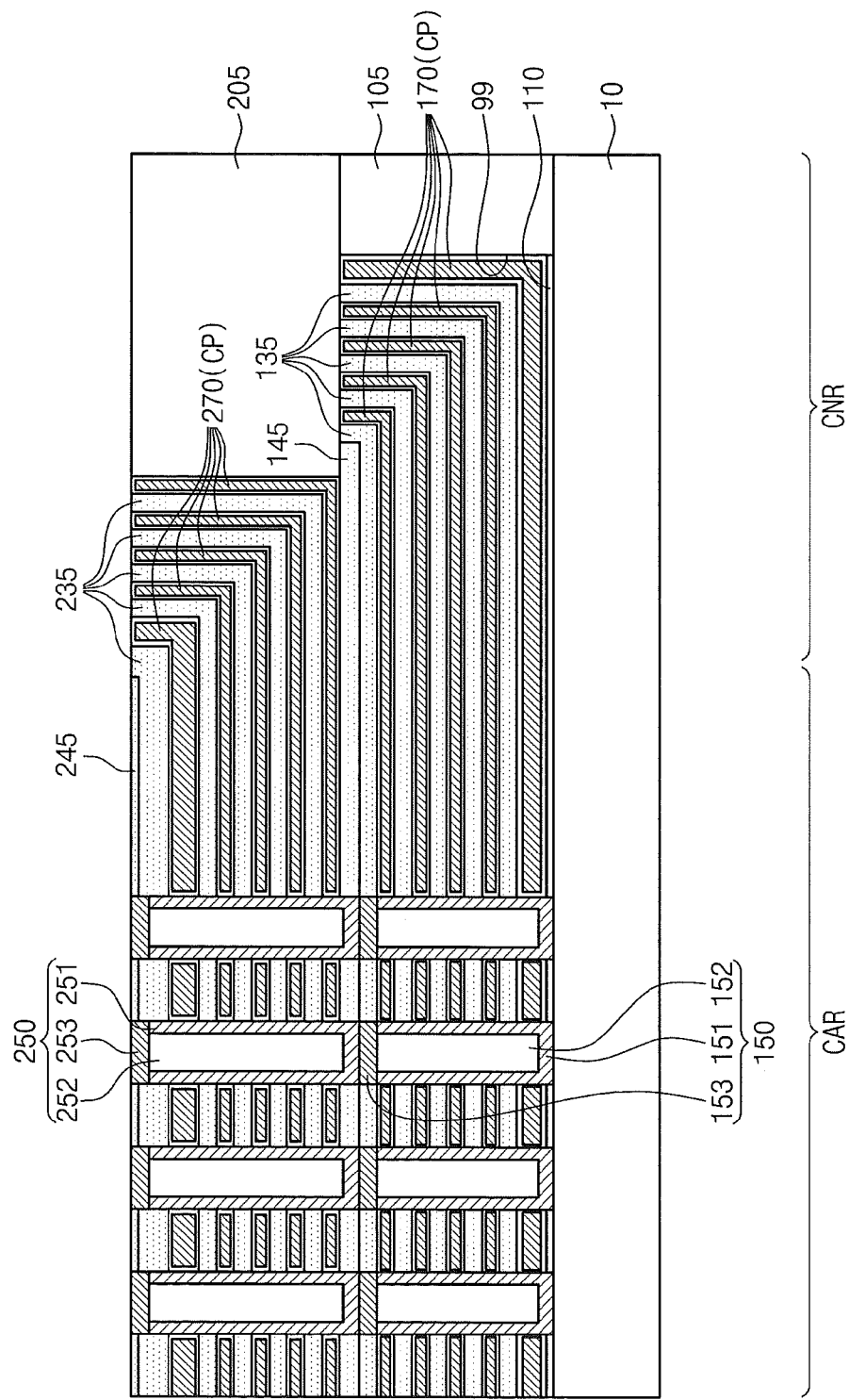

Referring to FIGS. 9a and 9b, gate patterns are formed to fill the recess regions 160. The gate pattern may include an information storage element ISE and a conductive pattern CP, which are sequentially formed on the inner wall of the recess region 160.

The forming of the gate patterns may include forming the information storage element ISE and a conductive layer, which cover sequentially the trenches 200 and the recess region 160, and removing portions of the conductive layer in the trenches 200 to form the conductive patterns CP, which remain in portions of the recess region 160. The trench 200 where the conductive layer is removed may be filled with an insulating layer.

The removing of the conductive layer in the trench 200 may include isotropic or anisotropic etching the conductive layer. The conductive layer is removed from the trench 200, such that the remaining conductive layer is formed into vertically separated conductive patterns CP. Thus the conductive patterns CP may be formed in portions of the recess regions 160 to be used as electrodes, which change information stored in the information storage element ISE.

In the meantime, because the gate patterns or the conductive patterns CP have shapes depending on the recess regions 160, they have horizontal portions parallel with the top surface of the substrate 10 and extension portions parallel with sidewalls of the first and second trenches 99 and 199. According to an embodiment of the inventive concept, however, conductive patterns CP replacing the first sacrificial patterns 125 (hereinafter, first conductive patterns 170) may be farther away than other conductive patterns CP replacing the second sacrificial patterns 225 (hereinafter, second conductive patterns 270), from the cell array region CAR.

In addition, the extension portions of the first conductive patterns 170 have top surfaces, which are exposed on a level with each other from the top surface of the substrate 10, and the extension portions of the second conductive patterns 270 have top surfaces, which are exposed on a level with each other from the top surface of the substrate 10. The extension portions of the second conductive patterns 270 have exposed top surfaces farther away than the top surface of the extension portions of the first conductive patterns 170 from the top surface of the substrate 10.

Figure 10A:
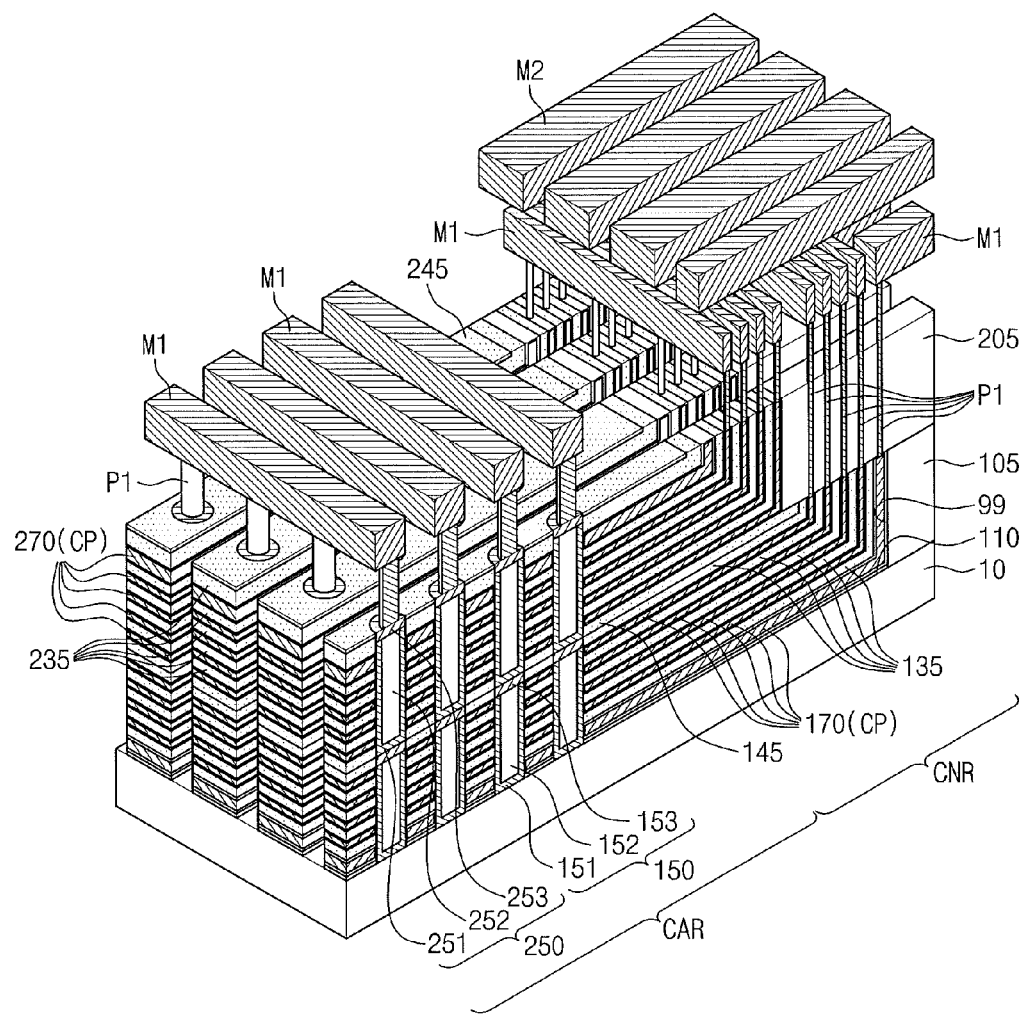
Figure 10B:
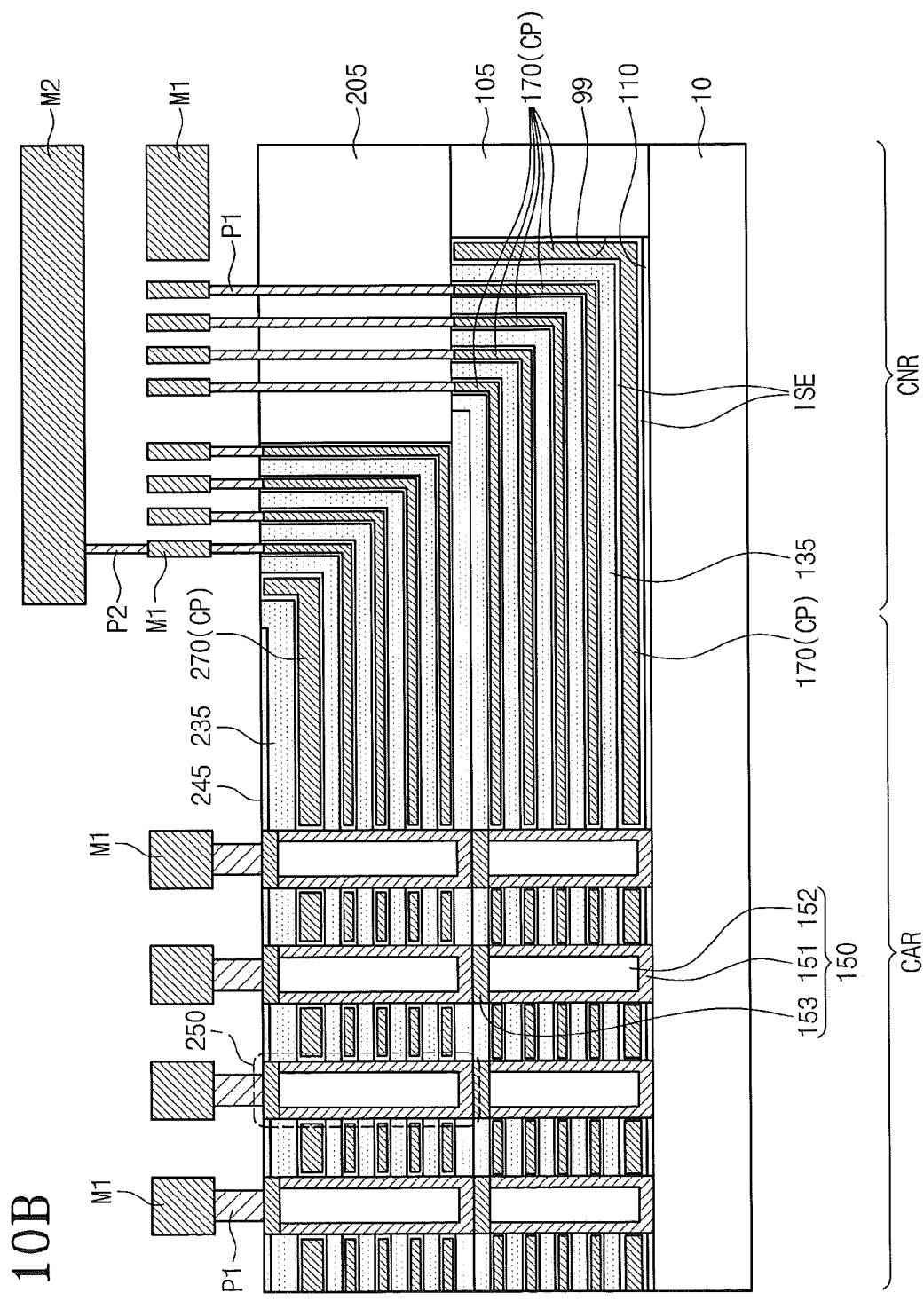

Referring to FIGS. 10a and 10b, an interconnection structure is formed on the resultant structure where the conductive patterns CP are formed. The interconnection structure may include a lower plug P1 connected to at least one of the extension portions of the conductive patterns CP and top portions of the second channel structures 250, a lower interconnection line M1 connected to the lower plug P1, an upper plug P2 connected to the lower interconnection line M1, and an upper interconnection line M2 connected to the upper plug P2.

According to an embodiment, the lower plugs connected to the extension portions of the gate patterns and the top regions of the second channel structures 250 may be formed simultaneously in the same process. Similarly, the lower interconnection lines connected to the extension portions of the gate patterns and the top portions of the second channel structures 250 may be formed simultaneously in the same process.

In addition, some lower plugs (hereinafter first lower plugs) connected to the first conductive patterns 170 and other lower plugs (hereinafter second lower plugs) connected to the second conductive patterns 270 may be formed simultaneously in the same process. In this case, as shown, the first lower plugs may be formed longer than the second lower plugs.

[3D NAND Flash Memory Device (1)]

Figure 11:
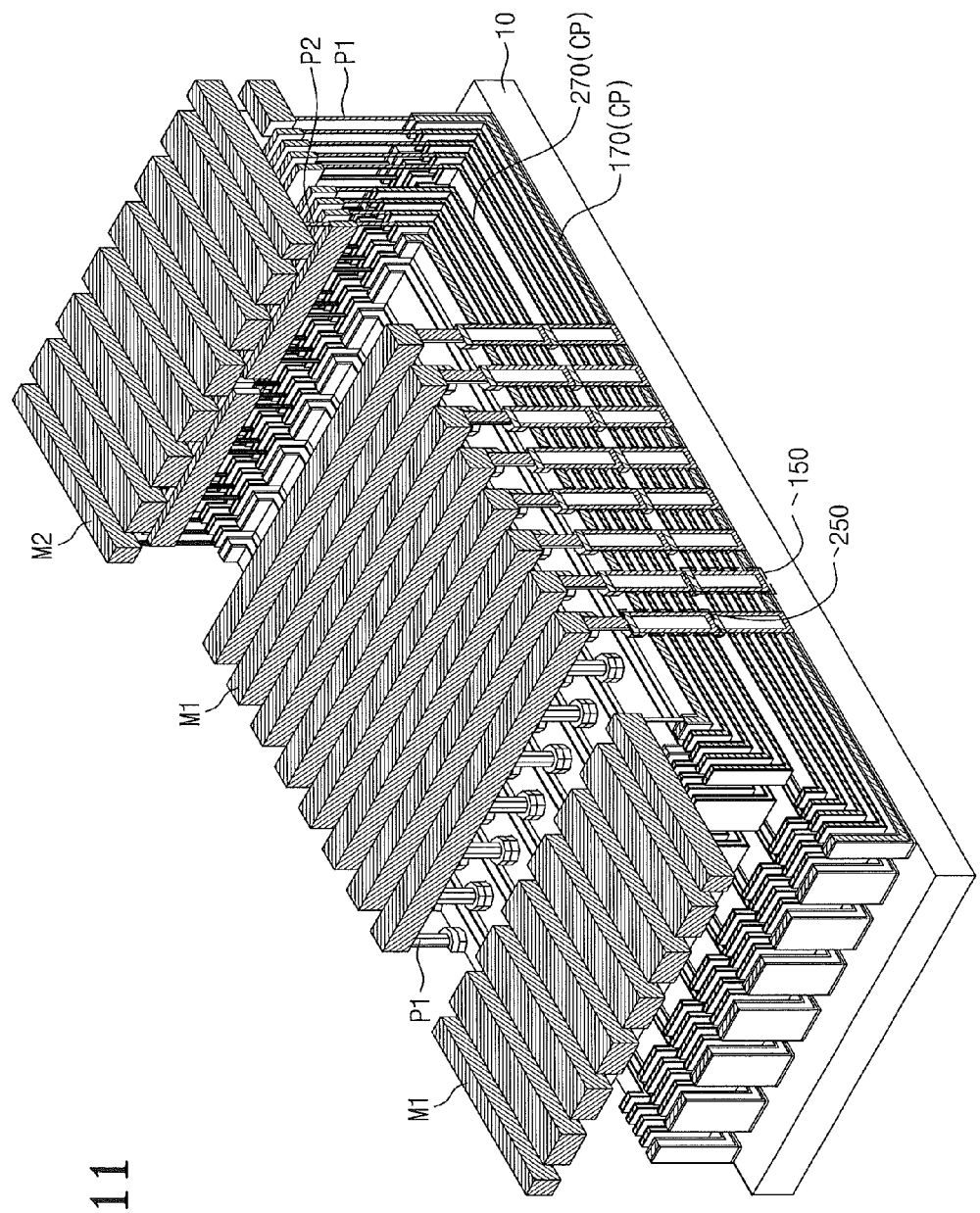
FIG. 11 is a perspective view illustrating a three-dimensional NAND-flash memory device and a method for fabricating the same according to an embodiment of the inventive concept.

FIG. 11 is a perspective view illustrating a three-dimensional NAND-flash memory device and a method for fabricating the same according to an embodiment of the inventive concept. For convenience in description, features described above with reference to FIGS. 1a through 10a may be omitted below.

Referring to FIG. 11, a word line structure consisting of conductive patterns CP is formed on the substrate 10, which includes a cell array region CAR and a connection region CR. The word line structure may include a first word line structure consisting of first conductive patterns 170 and a second word line structure consisting of second conductive pattern 270.

Channel structures penetrating the word line structure are arranged two-dimensionally on the substrate 10. Each of the channel structures may include the first channel structure 150 of FIG. 4b and the second channel structure 250 of FIG. 7b.

As described with reference to FIGS. 10a and 10b, an interconnection structure is disposed on the word line structure. The interconnection structure includes lower plugs P1, lower interconnection lines M1, upper plugs P2, and upper interconnection lines M2. According to an embodiment, portions of the lower interconnection lines P1 that are connected to the second channel structures 250 through the lower plugs P1 are formed to cross the electrode separating regions 200. The lower interconnection lines M1 may be used as bit lines in a three-dimensional NAND flash memory device.

A plurality of the conductive patterns may be electrically connected with each other by some of the lower interconnection lines M1, which are connected to the extension portions of the conductive patterns CP through the lower plugs P1. For example, as shown in FIG. 11, four conductive patterns CP are connected to a lower interconnection line M1 in common. A number of the conductive patterns CP connected to a specific lower interconnection line M1 may be modified in accordance with a design rule and standard of product or product characteristics during program/erase/read operations. The upper interconnection lines M2 may connect a peripheral circuit and a plurality of the conductive patterns CP connected to the lower interconnections M1.

In addition, portions of the conductive patterns CP, for example uppermost conductive patterns and lowermost conductive patterns, may be used as lower selection lines and upper selection lines, which control electrical connection of a NAND flash cell string. According to an embodiment, the uppermost conductive patterns used as the upper selection line may be electrically connected to the lower or upper interconnection lines M1 or M2 at a side of the cell array region, and the lowermost conductive patterns used as the lower selection line may be electrically connected to the lower or upper interconnection lines M1 or M2 as another side of the cell array region. In the three-dimensional NAND flash memory, the upper selection line may be used as a gate electrode of a string selection transistor, which controls electrical connection between a bit line and channel structures, and the lower selection line may be used as a gate electrode of a ground selection transistor which controls electrical connection between a common source line and the channel structures.

An information storage element ISE may be disposed between the word line structure and each of the channel structures. The information storage element ISE may include a charge storage layer. The information storage element ISE may further include a tunnel insulating layer, which is disposed between the charge storage layer and the active pattern, and a blocking insulating layer, which is disposed between the charge storage and the conductive pattern CP.

The charge storage layer may be one of an insulating layer rich in trap sites or an insulating layer including conductive nano-particles. According to an embodiment, the tunnel insulating layer may be one or more materials with a band gap wider than that of the charge storage layer, and the blocking insulating layer may be one or more materials with a band gap wider than that of the charge storage layer and narrower than that of the tunnel insulating layer. For example, the tunnel insulating layer may be a silicon oxide layer, and the blocking insulating layer may be one or more high-k dielectric layers, such as an aluminum oxide layer and a hafnium oxide layer. According to modified embodiment, the blocking insulating layer may be multilayer, which consists of a plurality of layers. For example, the blocking insulating layer may include an aluminum oxide layer and a silicon oxide layer.

Referring to FIGS. 9a and 9b, the information storage element may be formed of a thickness thinner than half the thickness of the recess regions 160 so as to secure a space for the conductive pattern CP. The information storage element ISE may be formed in a deposition process such as chemical vapor deposition or atomic layer deposition, which can form a layer with superior step coverage. Thus, the information storage element ISE may be formed to substantially conformally cover the resultant structure where the recess regions 160 are formed. In addition, if the first and second semiconductor patterns 151 and 251 are silicon, the tunnel oxide layer may be a silicon oxide layer, which is formed by thermal oxidizing the first and second semiconductor patterns 151 and 251. If this thermal oxidation is used to form the tunnel oxide layer, the information storage element may have different thicknesses on sidewalls of the first and second semiconductor patterns 151 and 251 on top/bottom sides of the first and second interlayer molds 135 and 235. For example, the tunnel insulating layer may not be formed on the top/bottom surface of the first and second interlayer molds 135 and 235, or may be formed of a thickness thinner on the top/bottom surface of the first and second interlayer molds 135 and 235 than on the sidewalls of the first and second semiconductor patterns 151 and 251.

The conductive pattern CP may be formed to fill the recess layers 160 and the trenches 200 that are covered by information storage element ISE. The conductive pattern CP may include at least one of tungsten, metal nitride, doped silicon and metal silicide. The information storage element ISE and the conductive layer may be changed in material and structure because the inventive concept does not restrict applications within flash memory devices.

In a modification of the fabricating method illustrated with reference to FIGS. 9a and 9b, after forming the electrode separation regions 200 or forming the conductive patterns CP, an ion implantation process may be further performed to form an impurity region CSL in the substrate 10. The impurity region may be used as an interconnection through which electrical signals to the memory cell are transmitted. For example, the impurity region CSL may be used as a common source line of the three-dimensional NAND flash memory.

Embodiment 2

FIGS. 12a through 19a are perspective views illustrating a method for fabricating a three-dimensional semiconductor device according to a second embodiment of the inventive concept, and FIGS. 12b through 19b are cross-sectional views illustrating a method for fabricating a three-dimensional semiconductor device according to the second embodiment of the inventive concept. Features described in the embodiment 1 and its modifications illustrated with reference to FIGS. 1a through 10a and 11 may be left out for briefly describing this embodiment 2.

Figure 12A:
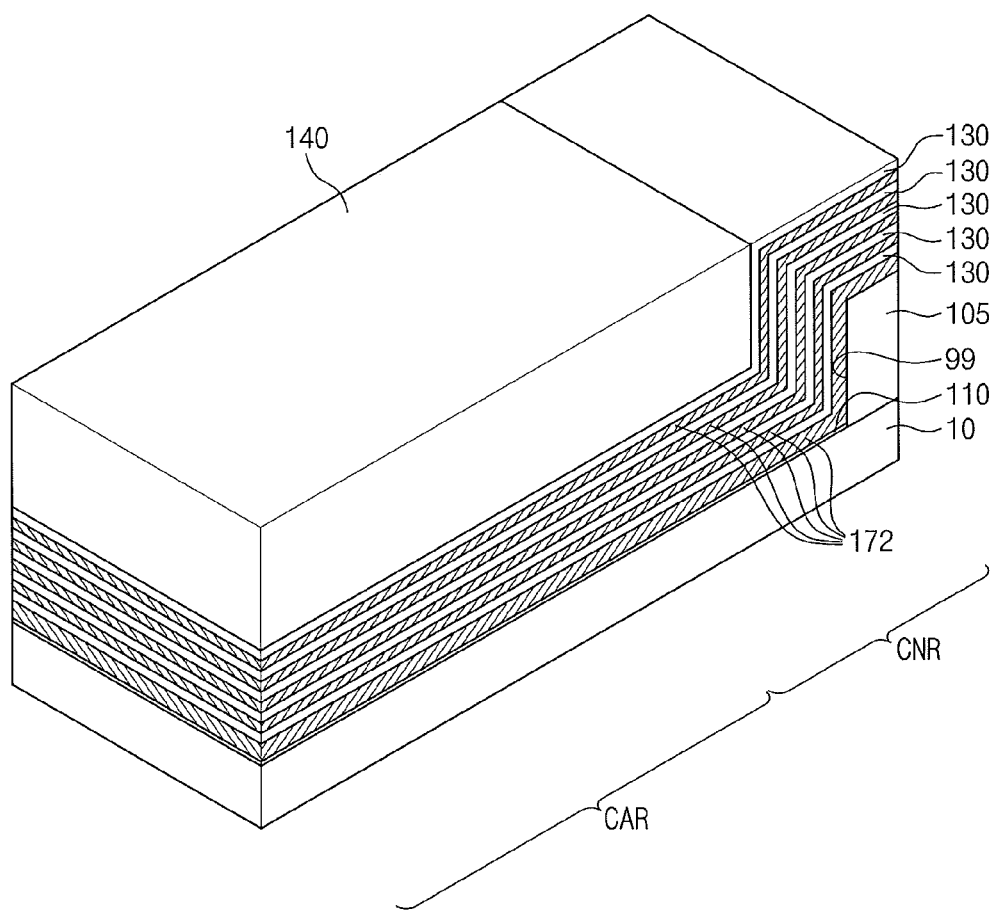
Figure 12B:
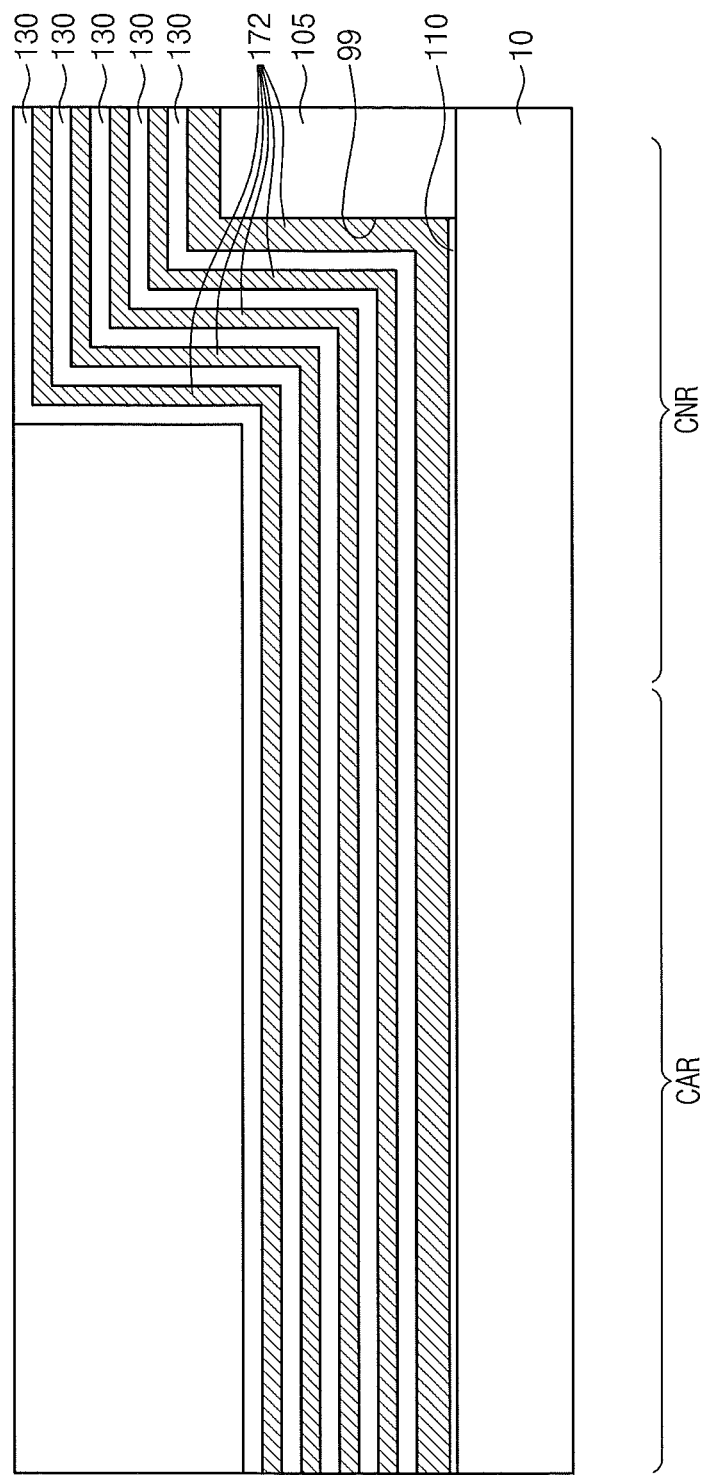

Referring to FIGS. 12a and 12b, a first outer mold 105 is formed on a substrate 10 and a first layered structure is then formed on the resultant structure where the first outer mold 105 is formed. The first layered structure may include sequentially and alternately stacked first conductive layers 172 and the first interlayer mold layer 130. The first conductive layers 172 may be a conductive material, for example, a doped silicon layer. This embodiment is distinct from the embodiment 1 in that the first layered structure includes conductive layers, such as the first conductive layers 172.

According to an embodiment, a buffer layer 110 may be further formed before forming the first layered structure. A first planarization layer 140 may be further formed on the first layered structure. The buffer layer 110 and the first planarization layer may be formed of the same material and in the same method as illustrated with reference to FIGS. 2a and 2b.

According to the embodiment, impurity regions may be formed on the substrate 10 before forming the first outer mold 105 or the first layered structure. In the three-dimensional flash memory device, the impurity region may be used as the common source line, which is described above. According to an embodiment, the impurity region may be formed on the entire cell array region. Alternatively, the impurity region may be formed to comprise a plurality of lines that are separated laterally with each other.

Figure 13A:
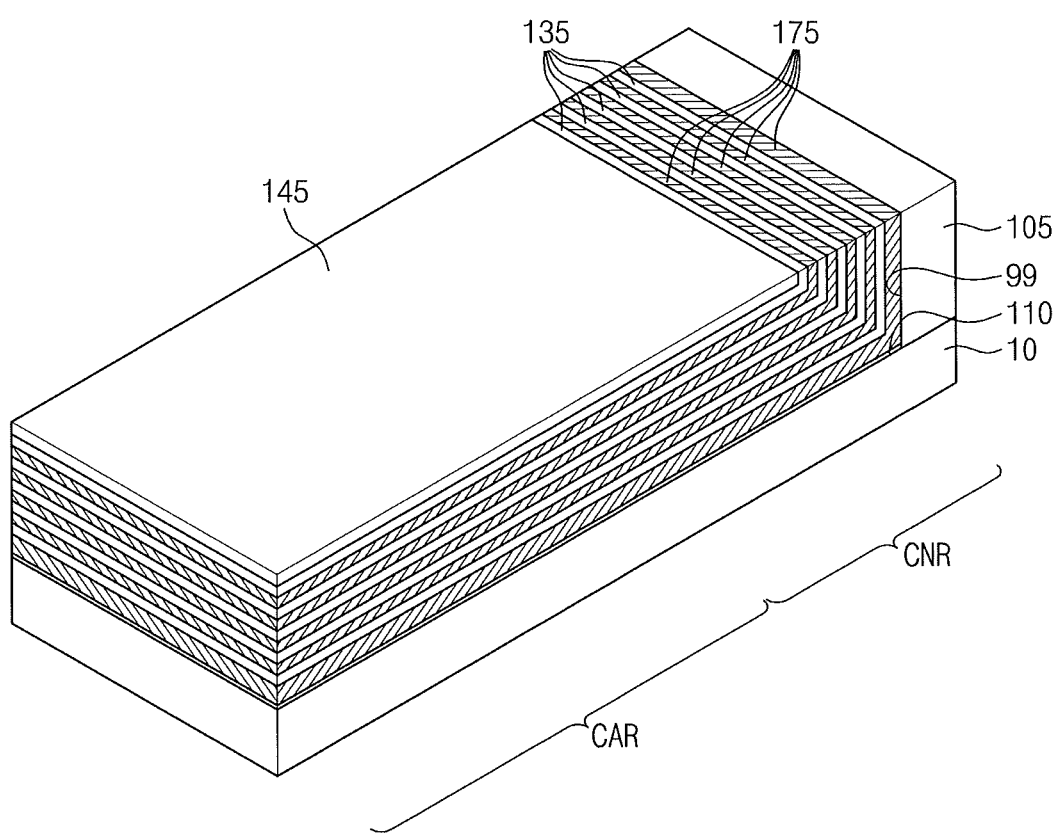
Figure 13B:
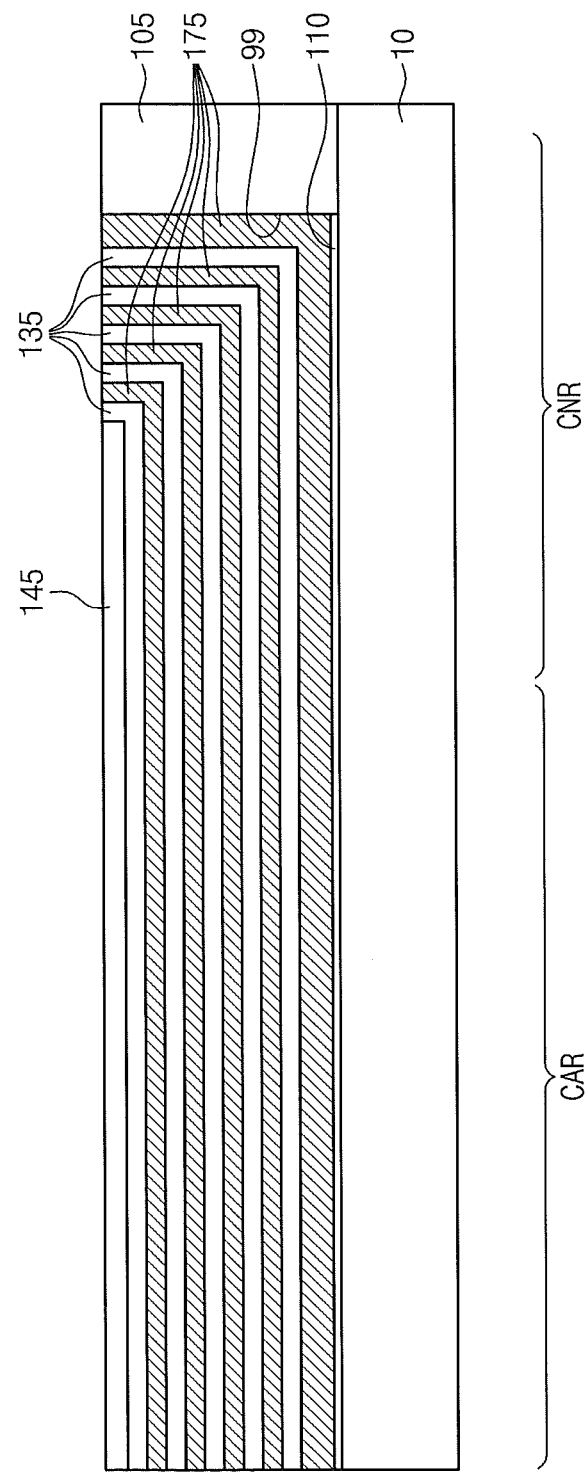

Referring to FIGS. 13a and 13b, the first layered structure is planarized to form a first structure. The planarization process may be performed such that a top surface of the first outer mold 105 is exposed. The first structure may include first electrode patterns 175 and first interlayer molds 135, which sequentially and alternately fill the first trench 99. As a result of the planarization process, the first planarization layer 140 may remain as a first planarized pattern 145 on the first trench 99.

Each of the first electrode pattern 175 and the first interlayer mold 135 may include a horizontal portion parallel with the top surface of the substrate 10 and an extension portion parallel with the side wall of the first trench 99. Due to the planarization process, the extension portions of the first electrode pattern 175 and the first interlayer mold 135 may have exposed top surfaces, which are level with each other from the top surface of the substrate 100. Thus, the first structure may be formed to have substantially the same thickness as the first outer mold 105.

Figure 14A:
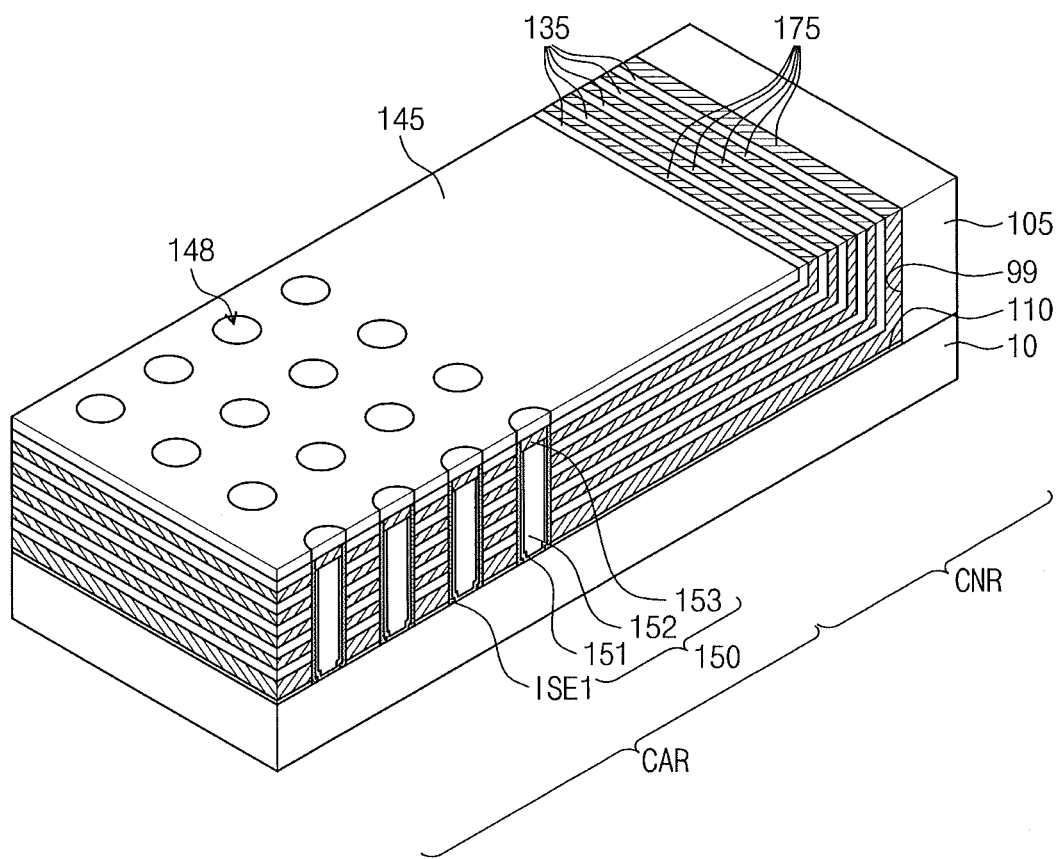
Figure 14B:
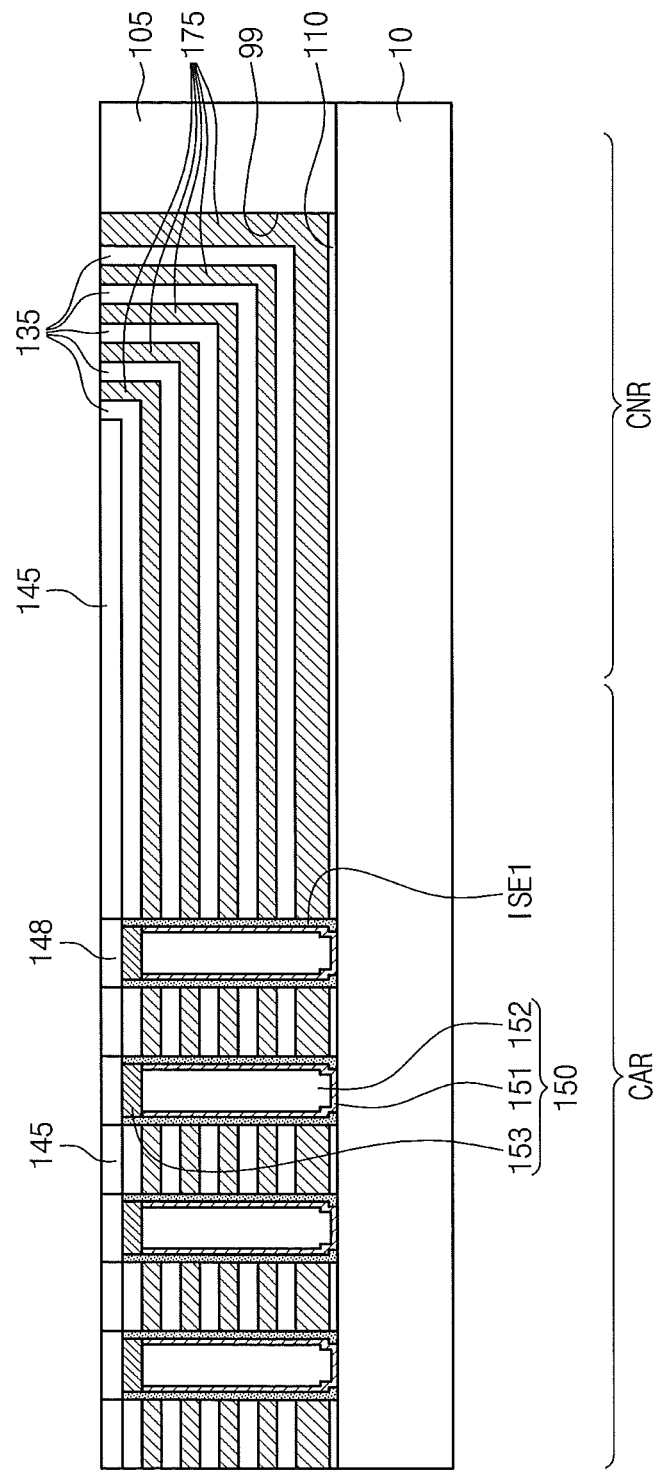

Referring to FIGS. 14a and 14b, first through holes penetrating the first structure are formed and a first information storage element ISE1 covering an inner wall of the first through hole is formed. Subsequently, the first channel structure 150 is formed to fill the first through hole where the first information storage element ISE1 is disposed. An upper buried pattern 148 filling an upper portion of the first through hole may be formed on the first channel structure 150.

Each of the first channel structures 150 may include a first semiconductor pattern 151 covering a bottom and a sidewall of the first through hole where the first information storage element ISE1 is formed. According to an embodiment, the first semiconductor pattern 151 may be formed to fill the first through hole. However, the first semiconductor pattern 151 does not completely fill the first through hole. In this case, a first semiconductor pad 153 may be formed above the first semiconductor pattern 151, and a first buried insulating pattern 152 may be formed in the through hole that is confined by the first semiconductor pattern 151 and the first semiconductor pad 153. The first semiconductor pattern 151, the first buried insulating pattern 152, and the first semiconductor pad 153 may be formed of the same or modified material and by the same or modified method as described with identical reference numbers in FIGS. 4a and 4b.

The first information element ISE1 may include a blocking insulating layer, which covers the inner wall of the first electrode pattern 175 exposed by the first through hole, a tunnel insulating layer, which covers the sidewall of the first semiconductor pattern 151, and a charge storage layer, which is disposed between the blocking insulating layer and the tunnel insulating layer. The blocking insulating layer, the tunnel insulating layer, and the charge storage layer may be formed of the same or modified material as described with reference to FIGS. 9a and 9b.

Although, in the first embodiment, the first tunnel insulating layer may be formed in a thermal oxidation, the tunnel insulating layer of this embodiment may be formed in a chemical vapor deposition. According to the embodiment, a bottom surface of the first information element ISE1 may be removed before forming the first channel structure 150 so that the first channel structure 150 is in contact with the substrate 10. The removal of the bottom surface of the first information storage element ISE1 may include forming a protective spacer, which covers the sidewall of the first information storage element ISE1 thereby reducing an etching damage of the first information storage element ISE1.

Figure 15A:
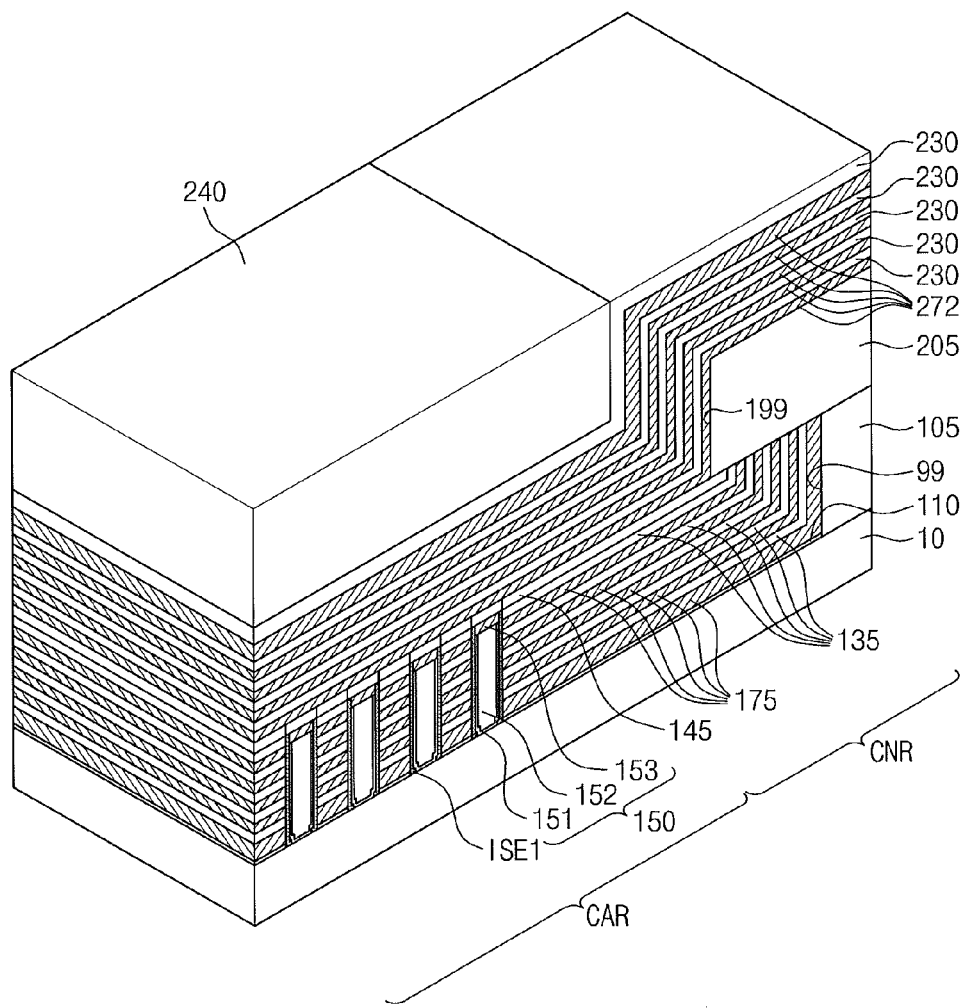

Referring to FIGS. 15a and 15b, a second outer mold 205 and a second layered structure are sequentially formed to define a second trench 199 on the resultant structure where the upper buried pattern 148 is formed. The second layered structure may include second conductive layers 272 and second interlayer molds 230 sequentially and alternately covering the resultant structure where the second outer mold 205 is formed. The second conductive layer 272 may be formed of substantially the same conductive material as the first conductive layer 172. For example, the first and second conducive layers 172 and 272 may be poly crystalline silicon. A second planarization layer 240 may be further formed on the second layered structure.

Figure 16A:
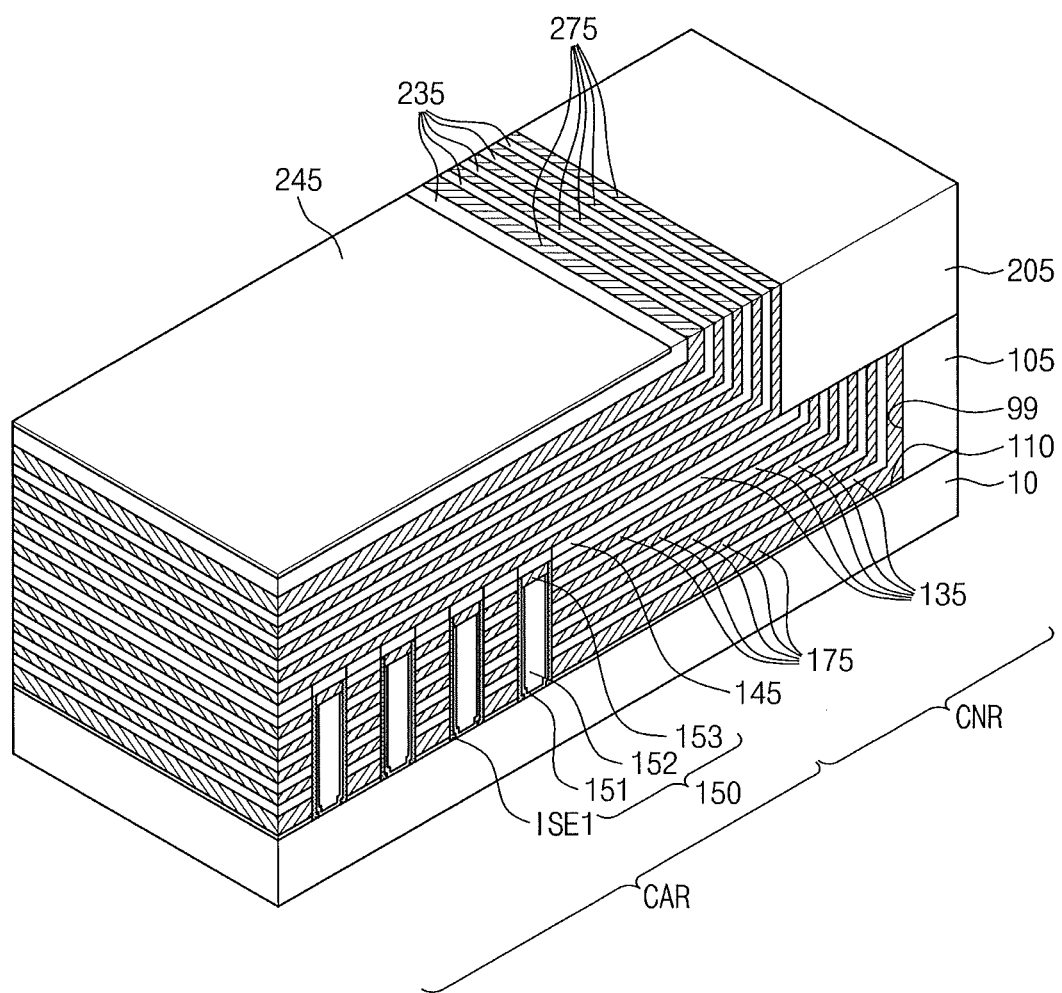
Figure 16B:
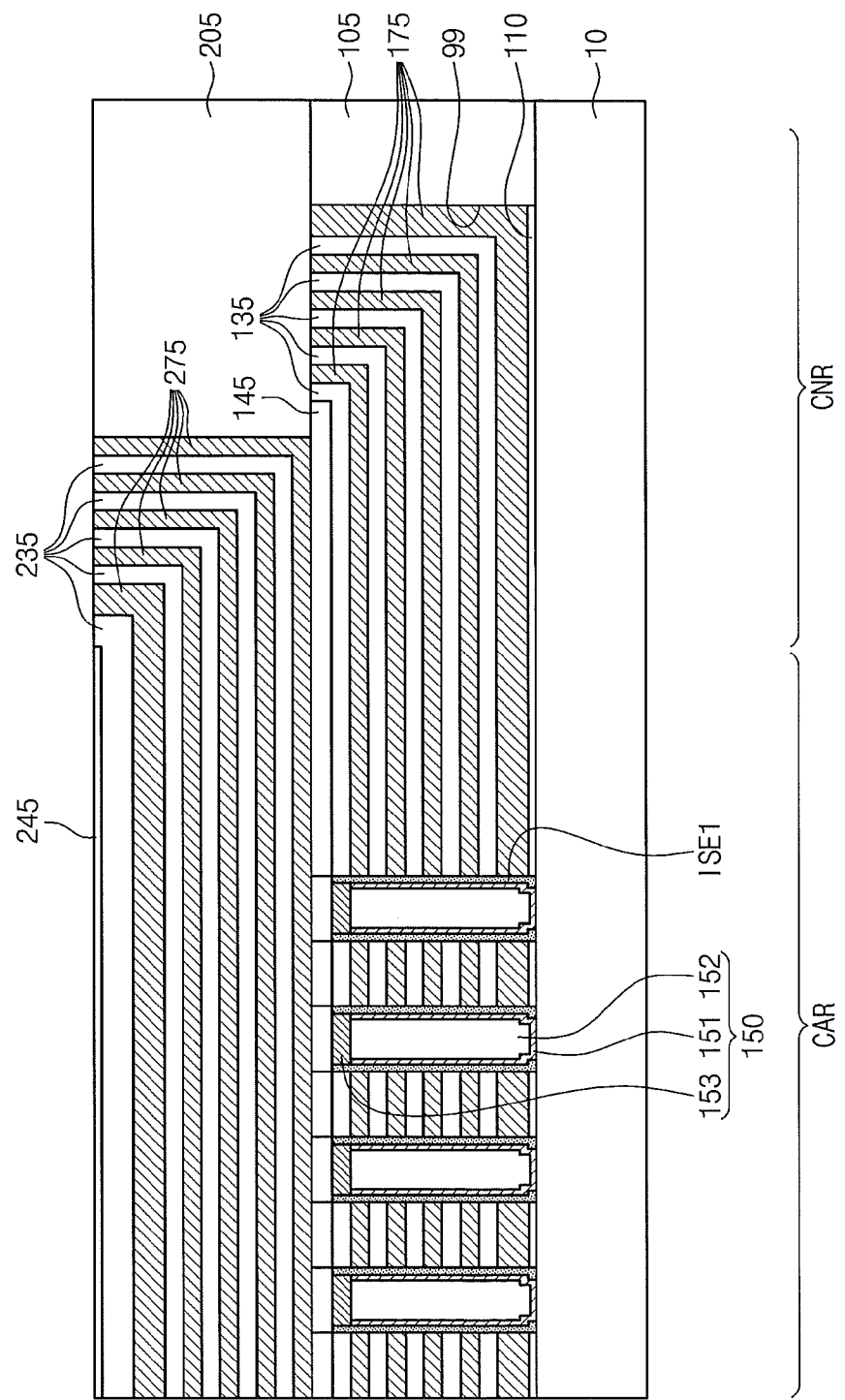

Referring to FIGS. 16a and 16b, the second layered structure is planarized to form a second structure. According to an embodiment, the planarization process may be performed so as to expose the top surface of the second outer mold 205. Therefore, the second structure may include second electrode patterns 275 and second interlayer molds 235, which fill the second trench 199 sequentially and alternately. As a result of the planarization process, the planarization layer 240 may remain as a second planarized pattern 245.

Because the first and second electrode patterns 175 and 275 may be formed using the first and second outer molds 105 and 205 as a mold, these electrode patterns 175 and 275 may have a horizontal portion parallel with the top surface of the substrate 10 and an extension portion parallel with the sidewalls of the trenches 99 and 199. The extension portion of the first electrode pattern 175 may be farther away than that of the extension portion of the first electrode pattern from the cell array region CAR.

The extension portions of the first electrode patterns 175 may have top surfaces, which are exposed at substantially the same level from the top surface of the substrate 10, and the extension portions of the second electrode patterns 275 may have top surfaces which are exposed at substantially the same level from the top surface of the substrate 10. In addition, the extension portions of the second electrode patterns 275 may have exposed top surfaces, which are farther away than the extension portions of the first electrode patterns 175 from the top surface of the substrate 10.

Figure 17A:
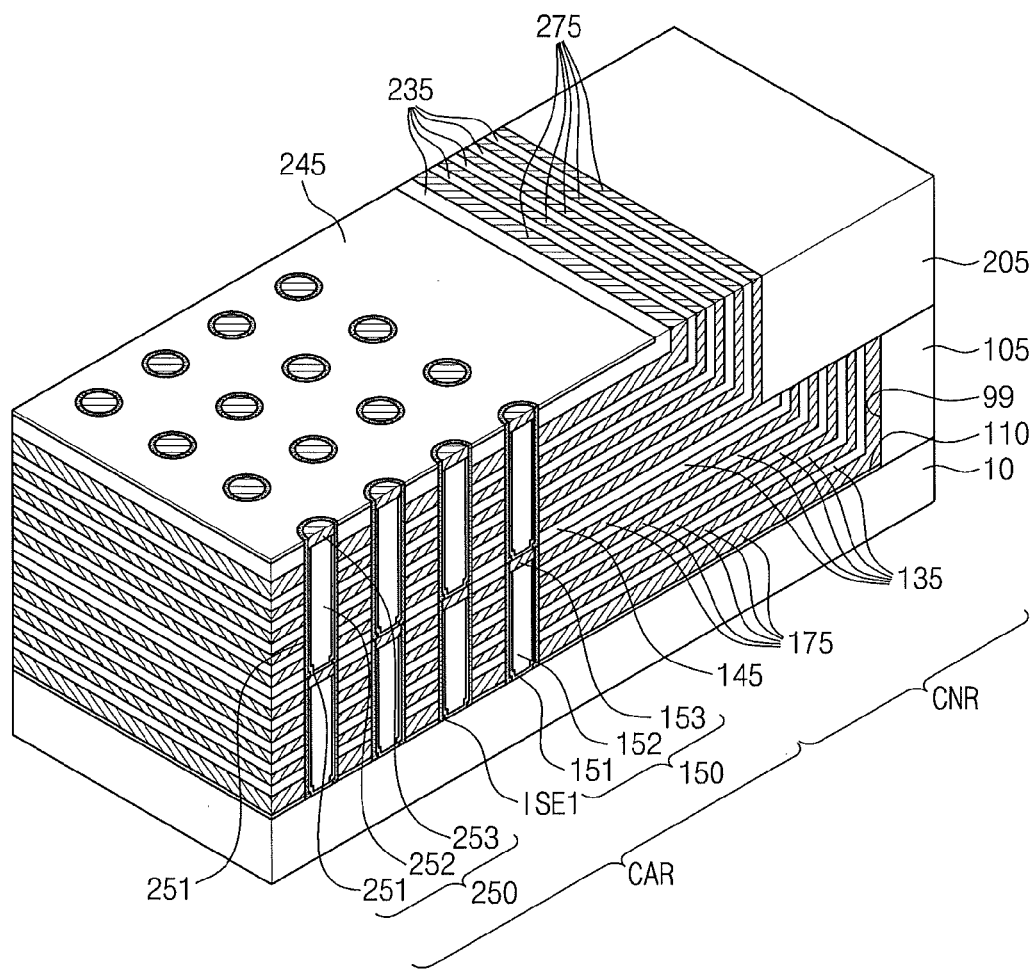
Figure 17B:
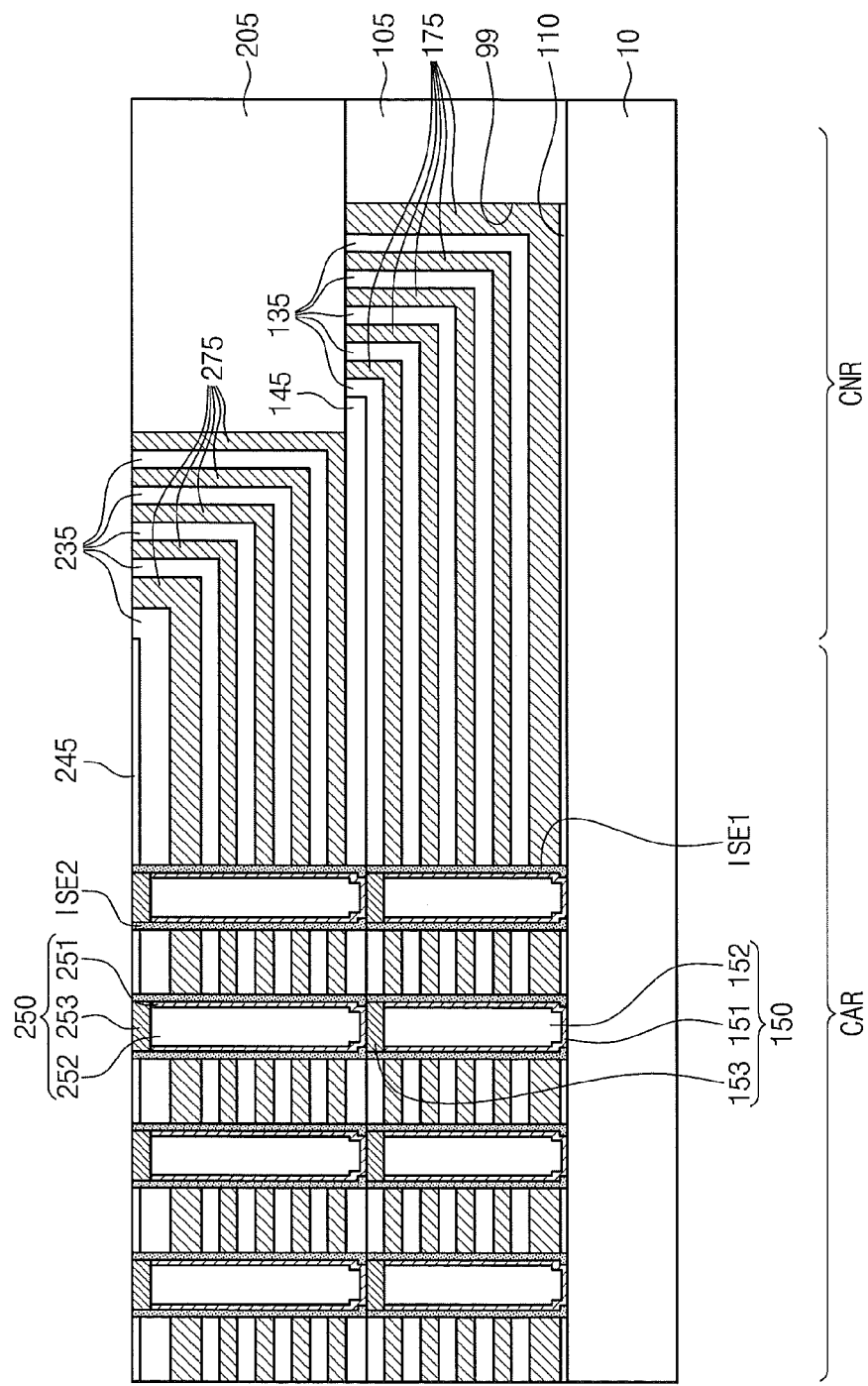

Referring to FIGS. 17a and 17b, second through holes penetrating the second structure are formed and a second information storage element ISE2 is then formed to cover inner walls of the second through holes. Subsequently, second channel structures 250 are formed to fill respectively the second through holes where the second information element ISE2 is formed. Each of the second through holes may be formed to expose the top surface of the first channel structure 150. Thus the second through holes are two-dimensionally formed on the substrate 10 similar to the arrangement of the first channel structure 150.

Each of the second channel structures 250 may include a second semiconductor pattern 251 covering a sidewall and a bottom surface of the second through hole where the second information element ISE2 is formed. According to an embodiment, the second semiconductor pattern 251 may be formed to fill the second through hole. However, the second semiconductor pattern 251 does not completely fill the second through hole. In this case, a second semiconductor pad 253 is further formed on the second semiconductor pattern 251 and a second buried insulating pattern 252 may be further formed in the second through hole, which is confined by the second semiconductor pattern 251 and the second semiconductor pad 253. The second semiconductor pattern 251, the second buried insulating pattern 252, and the second semiconductor pad 253 may be formed by the same or modified method with the same or modified material as described with the same reference numbers in FIGS. 7a and 7b.

The second information element ISE2 may include a blocking insulating layer, which covers an inner wall of the second electrode pattern 275 exposed in the second through hole, a tunnel insulating layer, which covers a sidewall of the second semiconductor pattern 251, and a charge storage layer, which is disposed between the blocking insulating layer and the tunnel insulating layer. The blocking insulating layer, the tunnel insulating layer, and the charge storage layer may be formed by the same or modified method with the same or modified material as described with reference to FIGS. 9a and 9b. The second information element ISE2 may be formed by the same method as the method of forming the first information element ISE1 described with reference to FIGS. 14a and 14b.

Figure 18A:
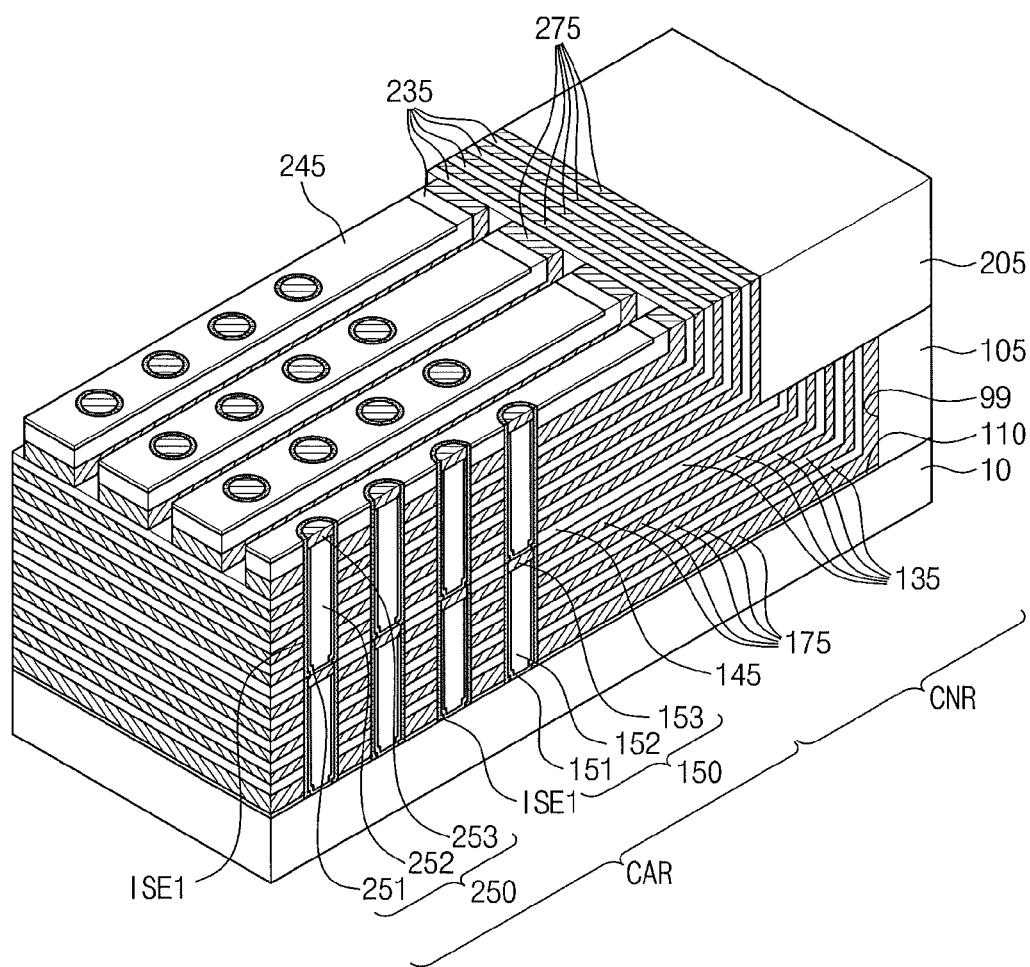
Figure 18B:
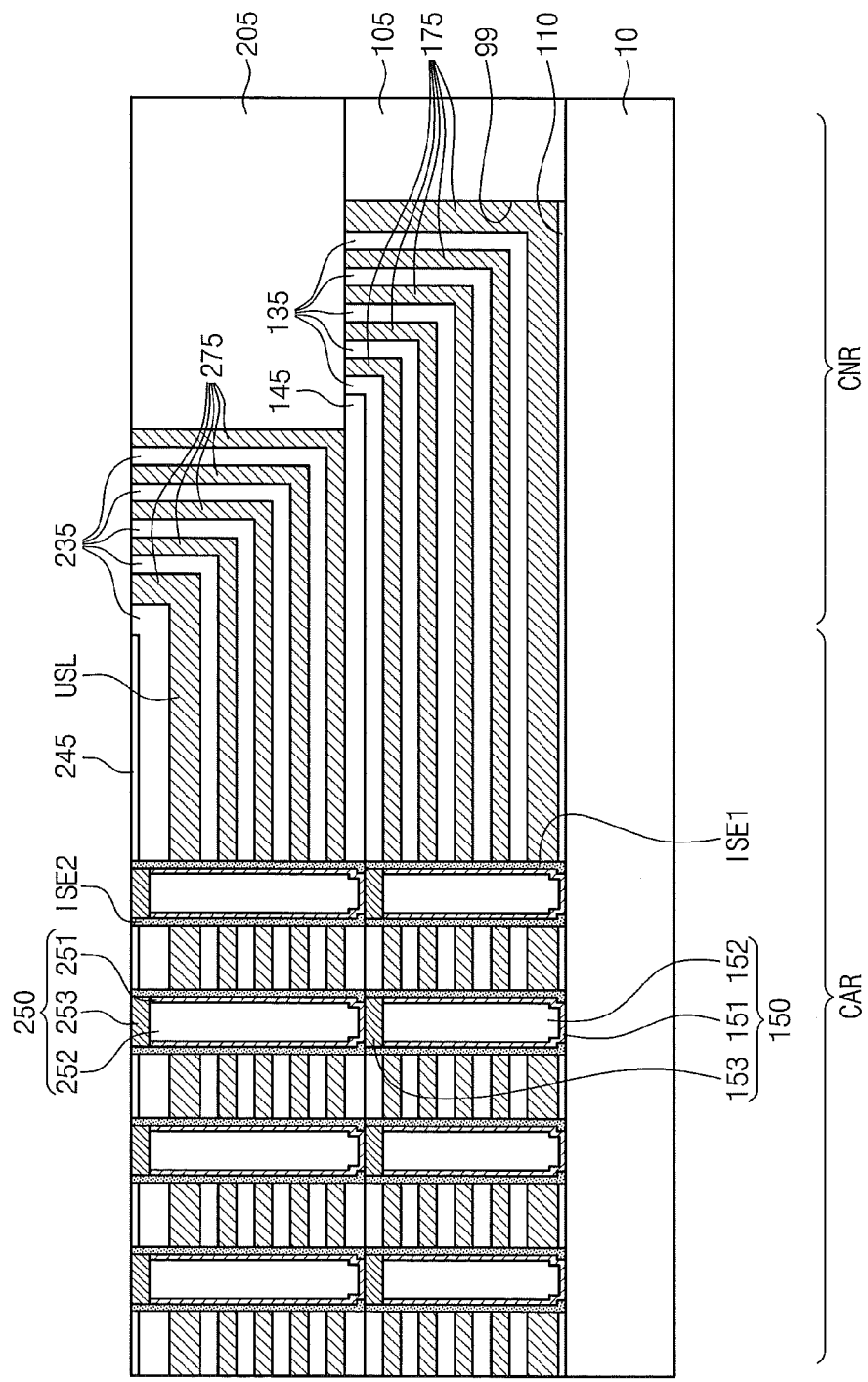

Referring to FIGS. 18a and 18b, the second electrode patterns 275 may be patterned to form upper selection lines USL, which are extended between the first and second channel structures 150 and 250. The upper selection lines USL may be formed to have sidewalls that are spaced apart from sidewalls of the first and second channel structures 150 and 250. Thus, the first and second channel structures 150 and 250 may be formed to penetrate the upper selection lines USL. According to an embodiment, the upper selection lines USL may be formed by patterning at least one of the second electrode patterns 275 at the uppermost level.

According to an embodiment of three-dimensional flash memory devices, the upper selection line USL may be used as a gate electrode of a string selection transistor of FIG. 11. At least one of the first electrode patterns 175 at the lowermost level may be used as a gate electrode of a ground selection transistor.

According to a modified embodiment of the inventive concept, the upper selection lines USL may be formed not by patterning the second electrode pattern 275 but by forming another layer and patterning the layer.

Figure 19A:
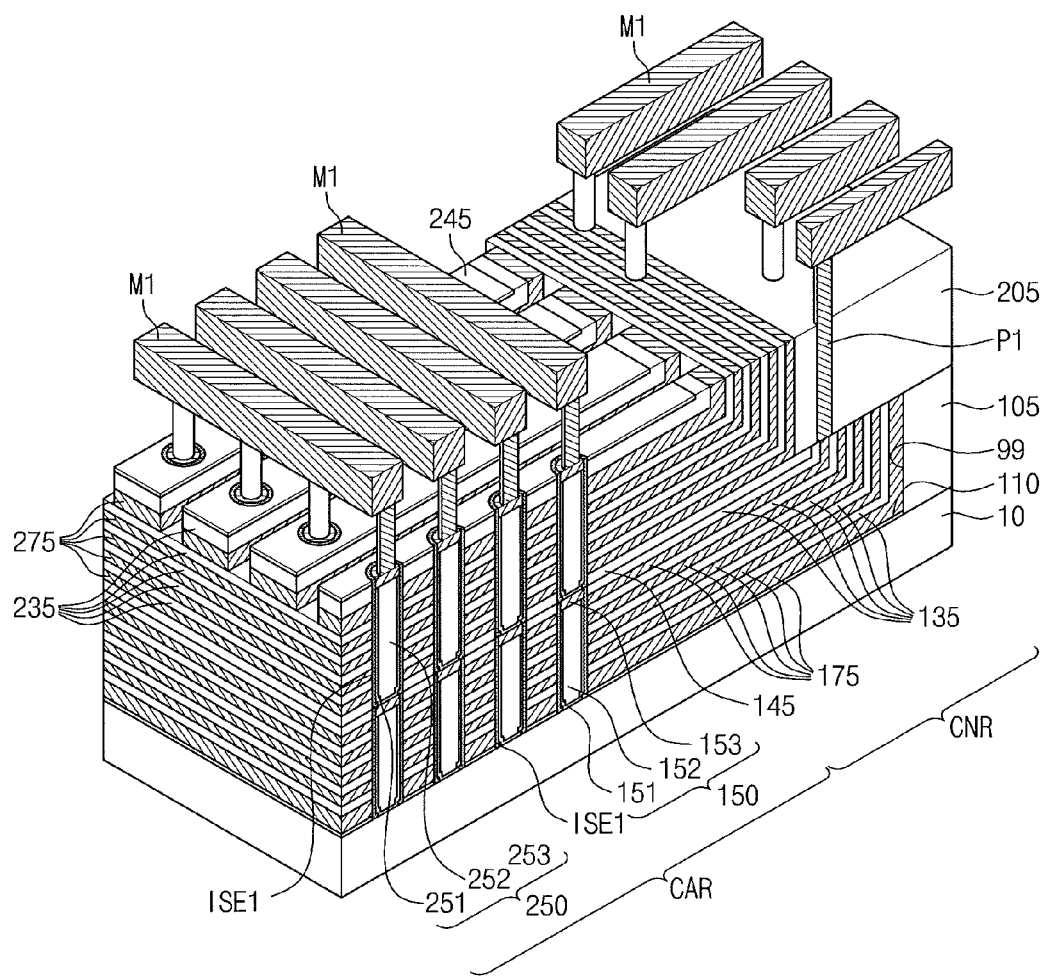
Figure 19B:
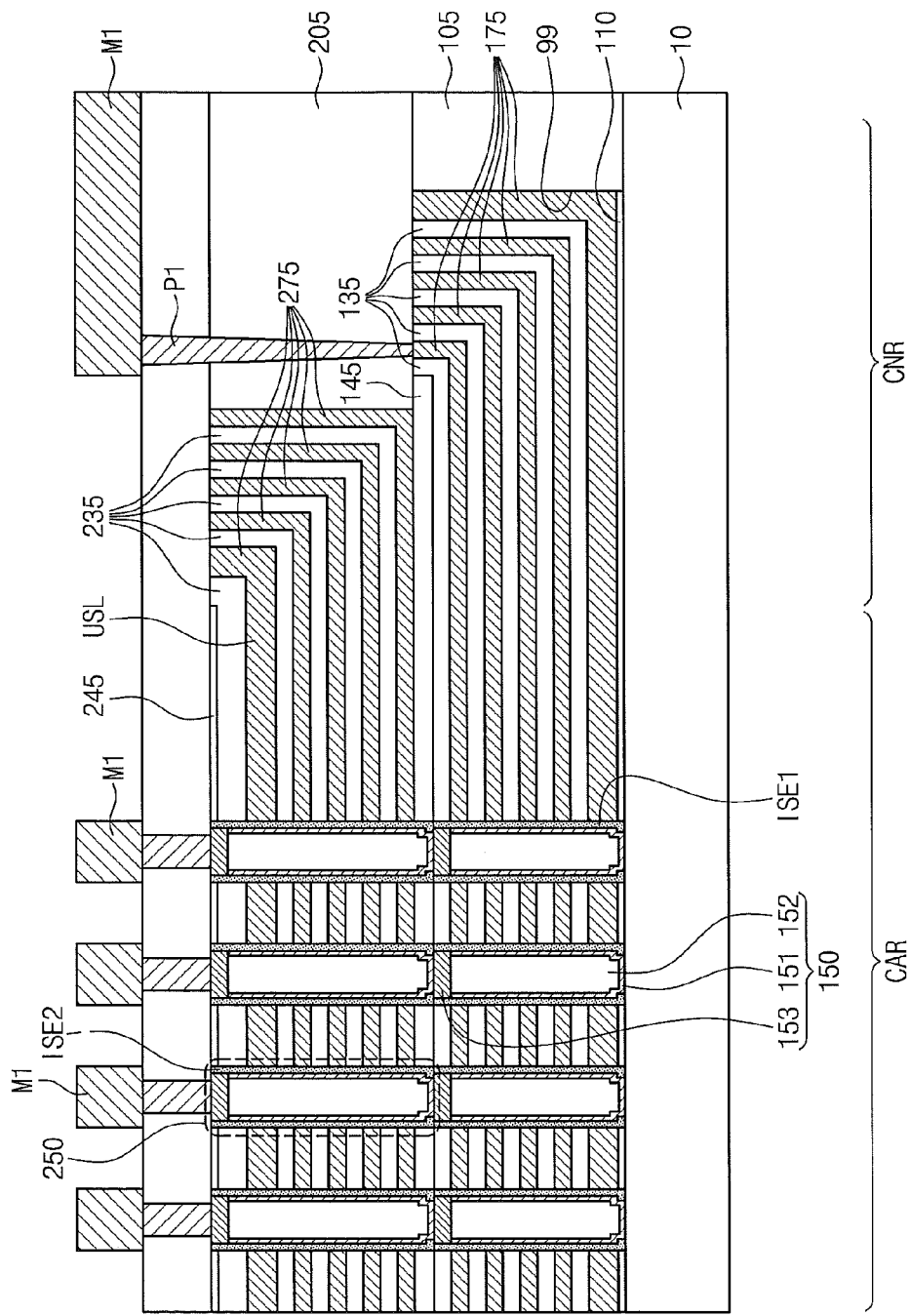

Referring to FIGS. 19a and 19b, an interconnection structure is formed on the resultant structure where the upper selection lines USL are formed. The interconnection structure may include lower plugs P1 and lower interconnection lines M1. The lower plug P1 is connected to at least one of the upper portions of the second channel structures and/or one of the extension portions of the first and second electrode patterns 175 and 275. The lower interconnection line M1 is connected to the lower plug P1. The lower plugs P1 and the lower interconnection lines M1 may be formed by the same method and material as described with the same reference number in FIGS. 10a and 10b.

In addition, the lower plug patterns (hereinafter first plugs) connected to the first electrode patterns 175 may be formed simultaneously with the lower plugs (hereinafter second plugs) connected to the second electrode patterns 275. A length of the first lower plug may be longer than that of the second plug.

Alternatively, after or before forming the upper selection lines USL, electrode horizontal separating regions may be formed to separate the first and second electrode patterns 175 and 275 laterally. By separating the first and second electrode patterns 175 and 275 laterally, a lower interconnection line M1 can be free from the necessity of controlling excessively many memory cells, as described with reference to FIG. 11. Four through thirty two first channel structures 150 along a direction across the upper selection line may be disposed between the two adjacent electrode horizontal separating regions.

According to the aforementioned embodiment 2, the first and second information storage elements ISE1 and ISE2 may be formed to cover outer sidewalls of the first and second channel structures 150 and 250, respectively. Accordingly, the first and second interlayer molds 135 and 235 may be spaced apart from the first and second channel structures 150 and 250. Alternatively, according to embodiments with reference to FIGS. 1 through 11, the information storage element ISE is formed to cover the sidewall, the top surface and the bottom surface of the conductive pattern CP, thereby the first and second interlayer molds 153 and 235 can be directly in contact with sidewalls of the first and second channel structures 150 and 250 between the conductive patterns CP as shown in FIG. 10b.

[Three-Dimensional NAND Flash Memory Device (2)]

Figure 20:
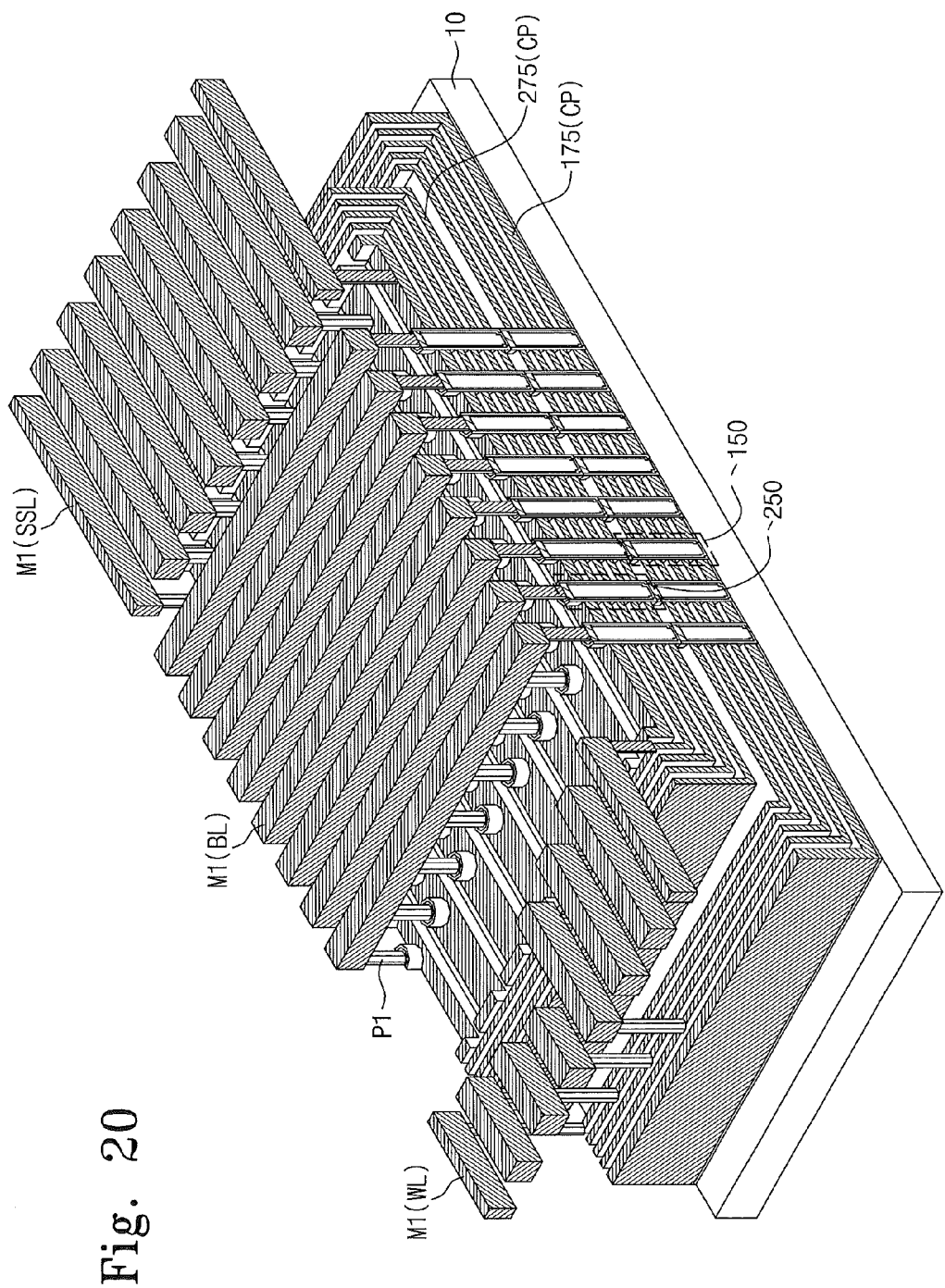
FIGS. 20 and 21 are perspective views illustrating a three-dimensional NAND flash memory device and a method for fabricating the same according to other embodiments of the inventive concept.
Figure 21:
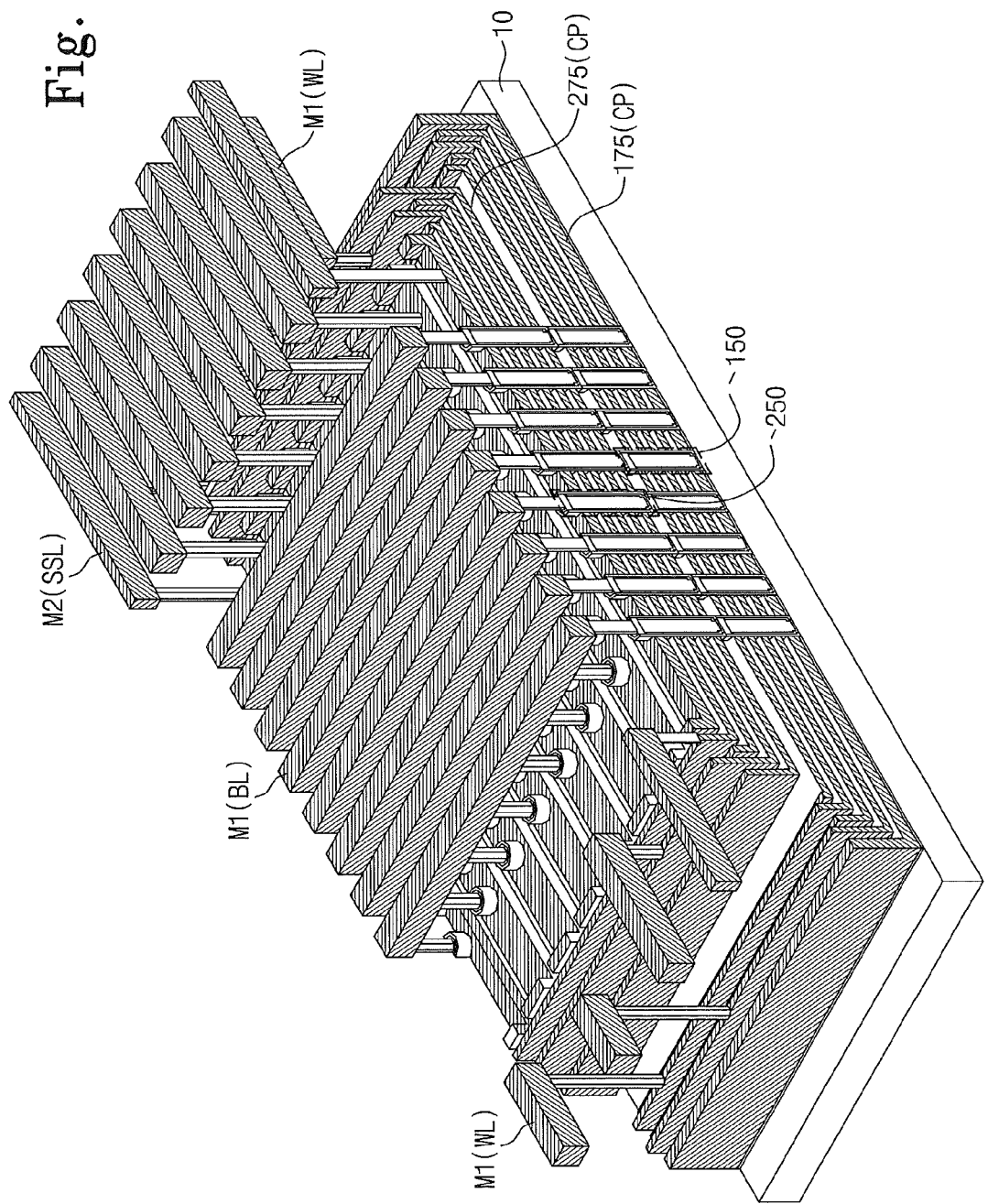

FIGS. 20 and 21 are perspective views illustrating a three-dimensional NAND flash memory device and a method for fabricating the same according to other embodiments of the inventive concept. Duplicate features described with reference to FIGS. 1 through 19 may be omitted for briefly describing the embodiments as follows.

Referring to FIGS. 20 and 21, a word line structure is formed on the substrate including a cell array region CAR and a connection region CNR. The word line structure may include a first word line structure, which includes the first electrode patterns 175 and a second word line structure, which includes the second electrode patterns 275.

In addition, channel structures are arranged in 2-dimensional arrangement on the substrate 10 to penetrate the word line structure. The channel structures may include the first channel structure 150 and the second channel structure 250, which are described with reference to FIGS. 14b and 17b, respectively.

As described with reference to FIGS. 19a and 19b, an interconnection structure including lower plugs P1 and lower interconnection lines M1 may be disposed over the word line structure. The lower interconnections M1 may be used as bit lines in the three-dimensional NAND flash memory devices as described in the foregoing embodiments.

According to a modified embodiment, the extension portions of the first and second electrode patterns 175 and 275 may have top surfaces that are formed at different levels. For example, as shown in FIG. 21, the first and second electrode patterns of even times in stacked order (even order) may have top surfaces lower than top surfaces of other first and second electrode patterns adjacent with the first and second electrode patterns of even order. Thus, a distance from a lower plug P1 connected with at least one of the first and second electrodes 175 and 275 to adjacent other first and second electrode patterns may be increased, thereby simplifying the manufacturing process and improving reliability of electrical connections.

In addition, according to the modified embodiment, the first and second electrode patterns 175 and 275 of even order may be connected to the upper interconnection lines M1 at one side of the cell array region, and the first and second electrode patterns 175 and 275 of odd times in the stacked order (odd order) may be connected to the upper interconnection lines M1 at another side of the cell array region. The upper selection lines USL, as shown in FIG. 21, may be connected to the upper interconnection lines M2 of FIG. 11.

Modified Embodiments

Figure 22A:
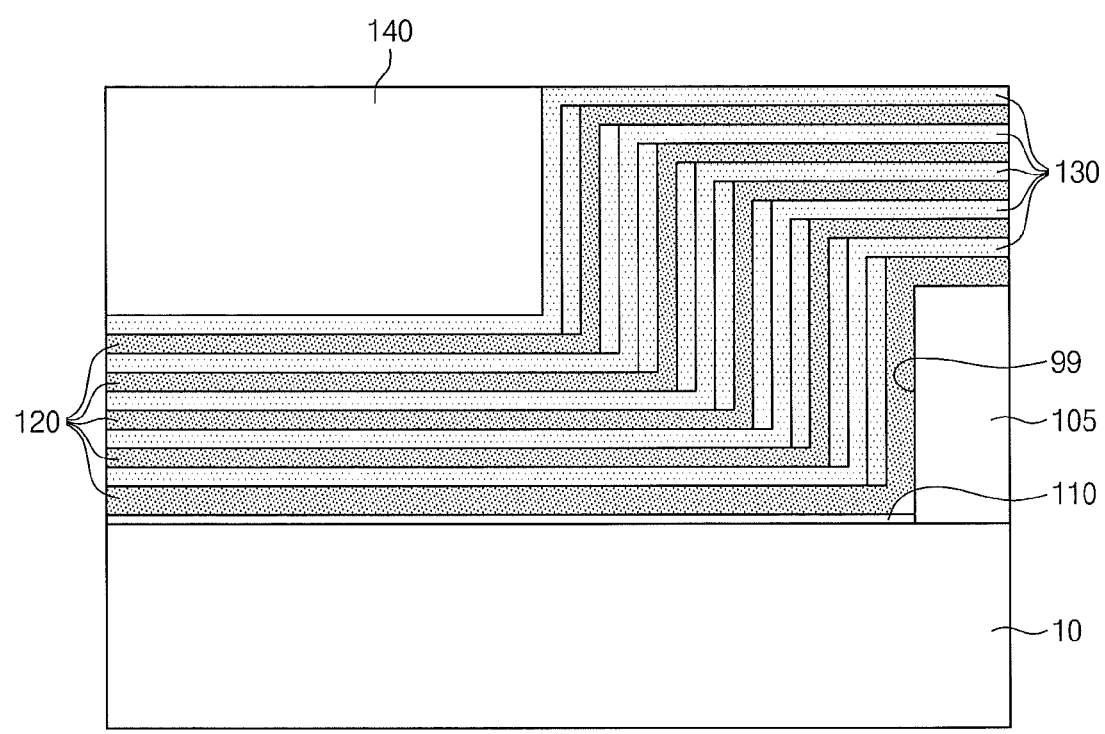
FIGS. 22a and 22b are cross-sectional views illustrating a method for fabricating a three-dimensional semiconductor device according to a modified embodiment of the inventive concept.
Figure 22B:
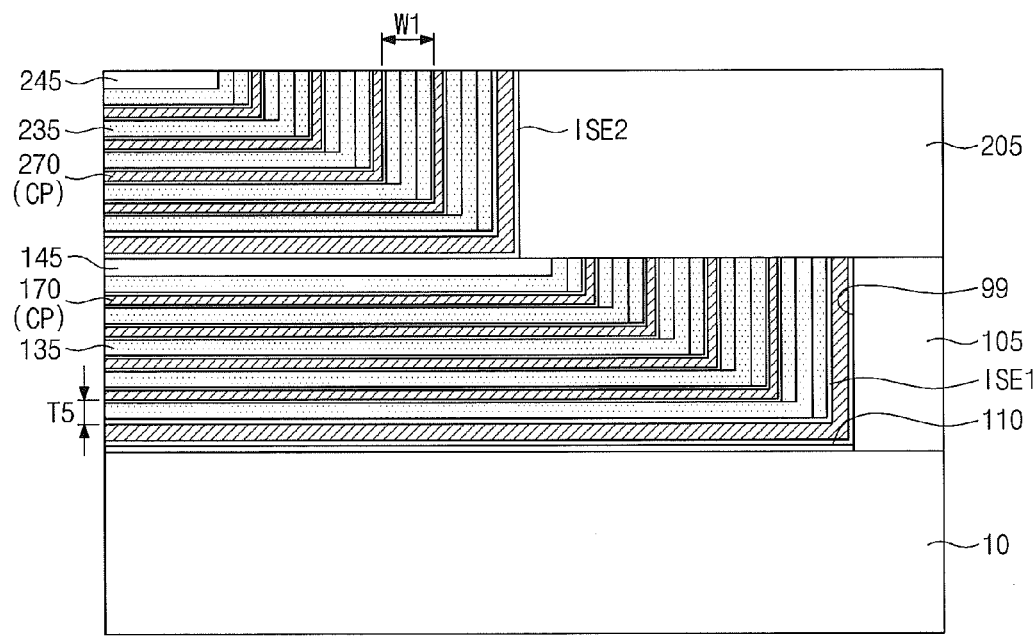

FIGS. 22a and 22b are cross-sectional views illustrating a method for fabricating a three-dimensional semiconductor device according to a modified embodiment of the inventive concept, and FIGS. 23a through 23c and FIGS. 24a through 24c are cross-sectional views illustrating a method for fabricating a three-dimensional semiconductor device according to other modified embodiments of the inventive concept. These modified embodiments are a modification of the embodiment 1, and may include substantially the same features as the embodiment 1 while including spacers. Thus, the description of duplicated features of the embodiment 1 may be omitted for briefly describing the following embodiments.

Referring to FIG. 22a, a first layered structure may further include spacers SPR, which are formed on sidewalls of the first interlayer mold layers 130 and the first sacrificial layers 120.

The forming of the spacers SPR may include conformally forming a spacer layer on beneath layers such as the first interlayer mold layer 130 or the first sacrificial layer 120 and anisotropically etching the spacer layer to expose a top surface of the beneath layer. The spacers SPR may be formed of substantially the same material as the first interlayer mold layer 130 or a material having an etching selectivity to the first sacrificial layer 120. In this case as a result of the manufacturing process that is described with reference to FIGS. 2 through 9, as shown in FIG. 22b, the distance W1 between the extension portions of the conductive patterns CP may be longer than a vertical distance T5 between the horizontal portions of the conductive patterns CP.

Therefore, a pair of spacers SPR as well as the first and second interlayer molds 135 and 235 are formed between the extension portions of the conductive pattern CP while the first and second interlayer molds 135 and 235 are disposed between the horizontal portions of the conductive patterns CP. As the distance between the extension portions of the conductive patterns is increased, a conductive plug P1 can be spaced farther apart from adjacent first and second electrode patterns 175 and 275, as described with reference to FIG. 21.

Figure 23A:
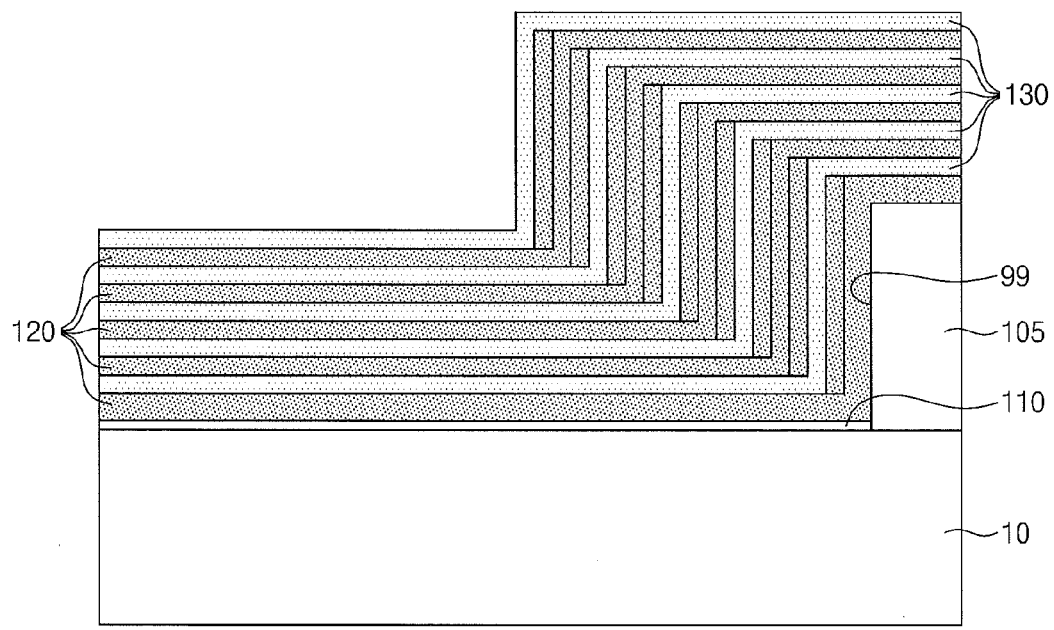
FIGS. 23a through 23c and FIGS. 24a through 24c are cross-sectional views illustrating a method for fabricating a three-dimensional semiconductor device according to other modified embodiments of the inventive concept.
Figure 23B:
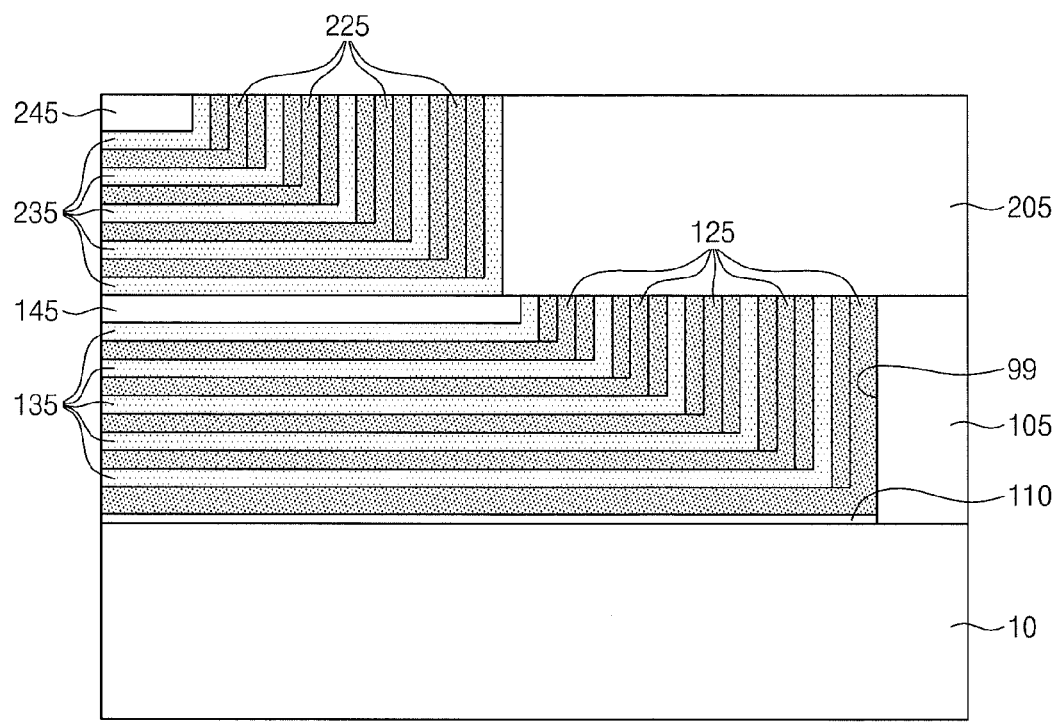
Figure 23C:
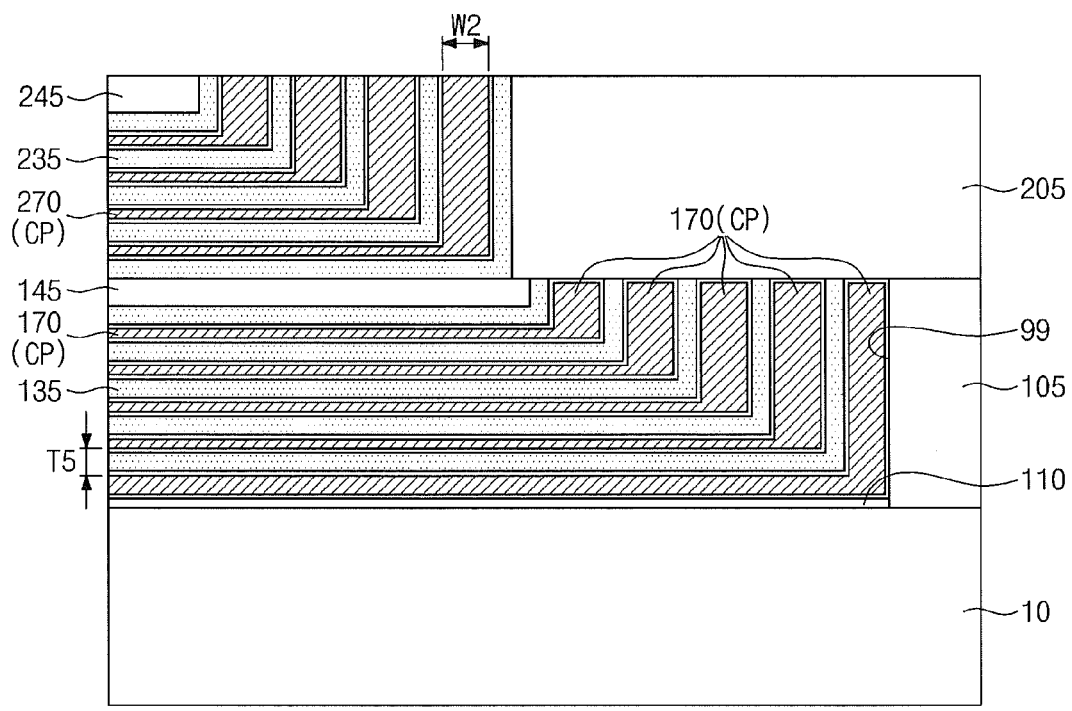

According to other modified embodiments of the inventive concept, as shown in FIG. 23a, the spacers SPR may be formed of substantially the same sacrificial layers 120. As a result of the manufacturing process described with reference to FIGS. 2 through 9, the width W2 of the extension portions of the conductive patterns CP may be thicker than the thickness of the horizontal portions of the conductive patterns CP, as shown in FIG. 23c. Thus the reliability of the electrical connection can be improved and improvements to the manufacturing process can be facilitated because the extension portion of the conductive pattern CP can have a top surface with a relatively wider area for connecting the lower plug P1.

Figure 24A:
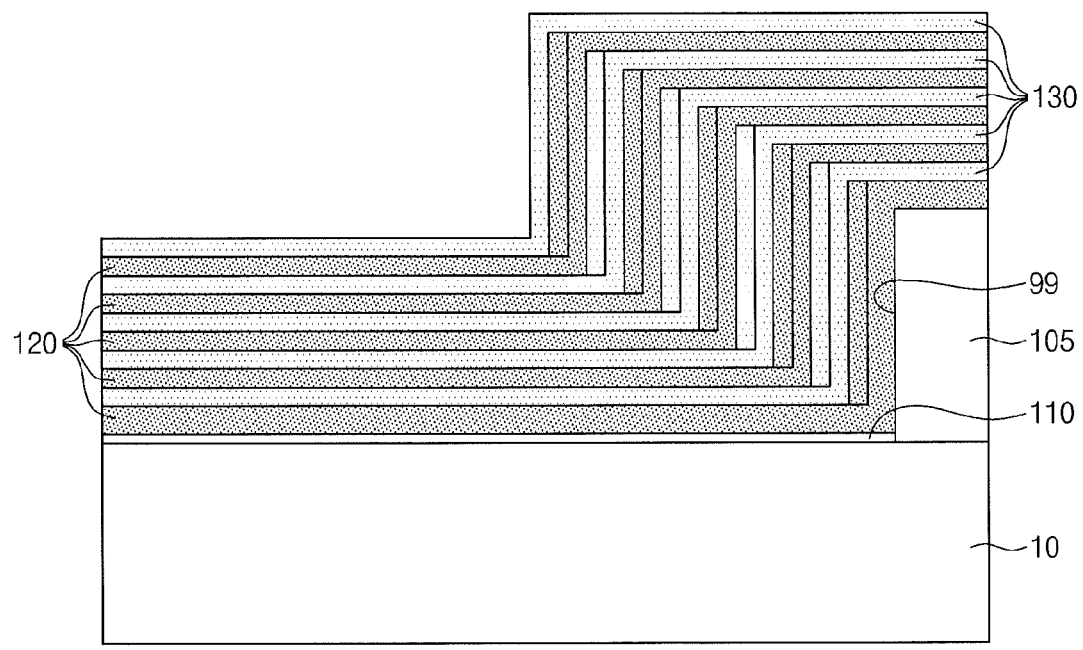
Figure 24B:
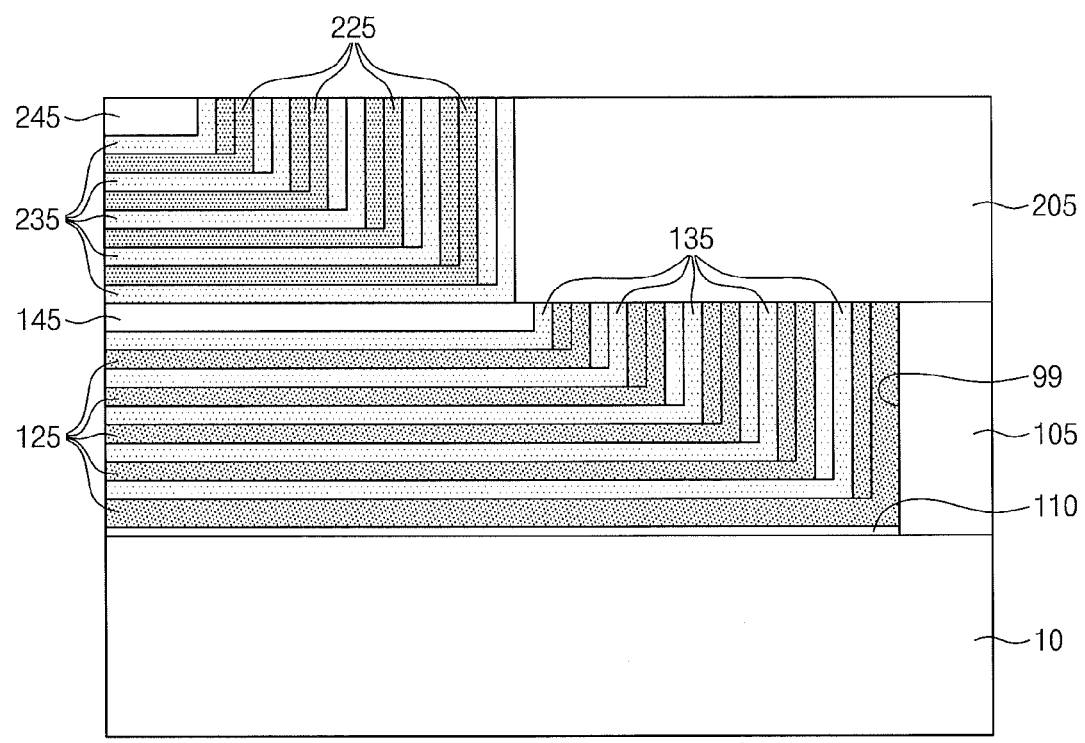
Figure 24C:
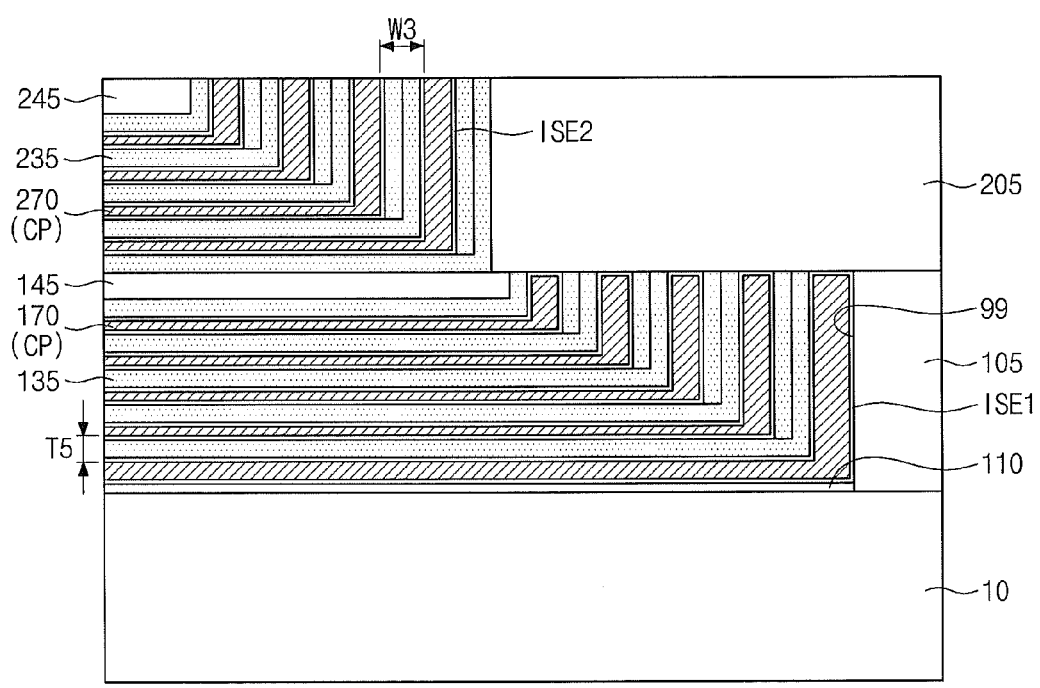

According to still other modified embodiments, as shown in FIGS. 24a through 24c, portions of the spacers SPR may be formed of a material having an etching selectivity with respect to the first sacrificial layers 120 and other portions of the spacers SPR may be formed of substantially the same material as the first sacrificial layers 120. Thereby, the technical effects of the embodiments, which are described with reference to FIGS. 22 and 23 can be further obtained.

The modified embodiments described with reference to FIGS. 22 through 24 may be applied to the embodiment 2 of the inventive concept, which is described with reference to FIGS. 12a through 19a. Thus, description of the additional modifications for the embodiment 2 will be omitted.

Figure 25A:
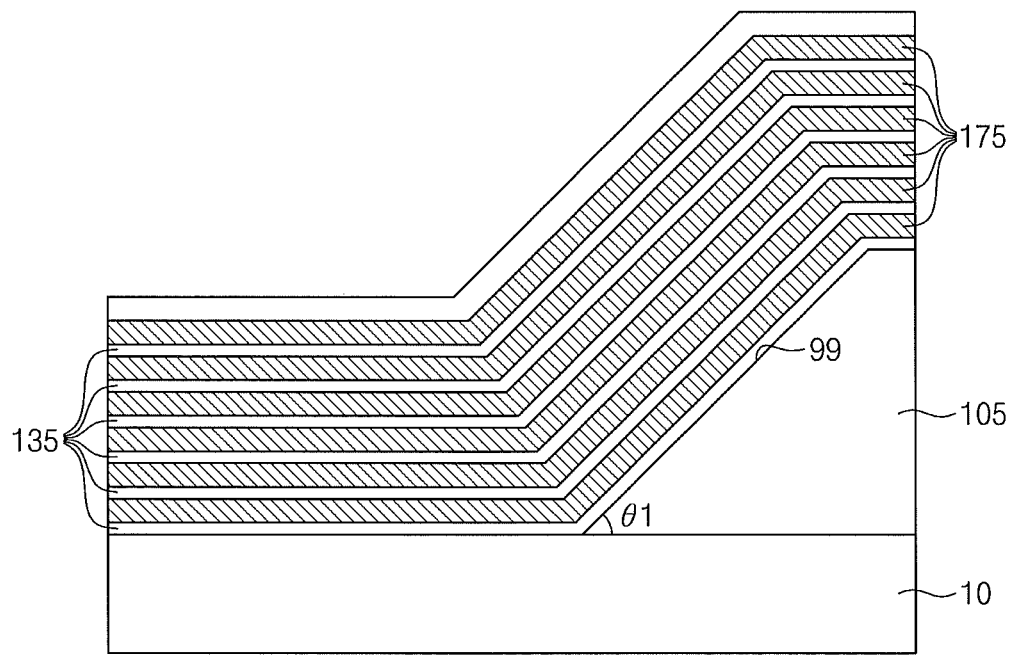
FIGS. 25a and 25b are cross-sectional views illustrating a method for fabricating a three-dimensional semiconductor device according to still other modified embodiments of the inventive concept.
Figure 25B:
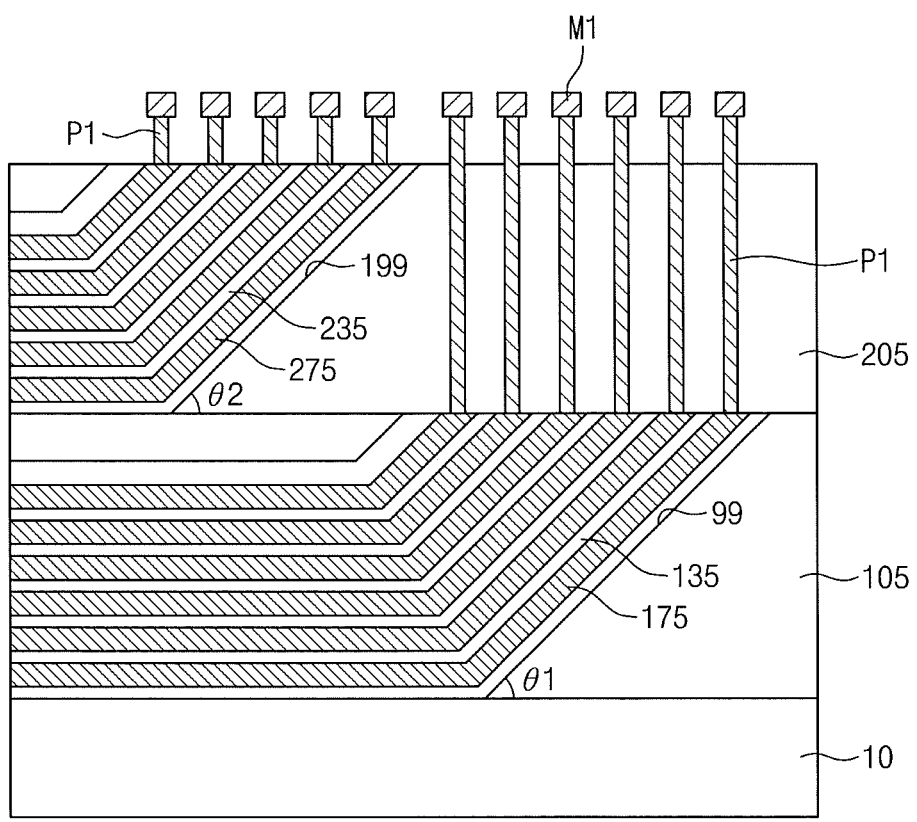

FIGS. 25a and 25b are cross-sectional views illustrating a method for fabricating a three-dimensional semiconductor device according to still other modified embodiments of the inventive concept. This modified embodiment is a modification of the embodiment 2 and may include substantially the same features as the embodiment 2 while including a feature with respect to the slope of a trench sidewall. Thus, the description of duplicated features to the embodiment 2 may be omitted for briefly describing the following embodiments.

Referring to FIG. 25a, the first outer mold 105 may have a sidewall sloped with respect to the top surface of the substrate 10. For example, a first angle $\theta_1$ between the sidewall of the first trench 99 and the top surface of the substrate 10 may be about 30 degrees through about 60 degrees. A second angle $\theta_2$ between the sidewall of the second trench 199 and the top surface of the substrate 10 may be about 30 degrees through about 60 degrees. According to an embodiment, the first angle $\theta_1$ and the second angle $\theta_2$ may be substantially the same. In other embodiments, the first angle $\theta_1$ and the second angle $\theta_2$ may be different.

As shown in FIG. 25b, as a result of the manufacturing process, which is described with reference to FIG. 13a through 19a, the top surface of the extension portions of the first and second electrode patterns 175 and 275 may have a wider area than in the embodiment 2. Therefore, the reliability of the electrical connection to the lower plugs P1 can be improved.

In addition, an embodiment described as follows may be applicable to the embodiment 1 of the inventive concept illustrated with reference to FIG. 1 through 11.

Figure 26:
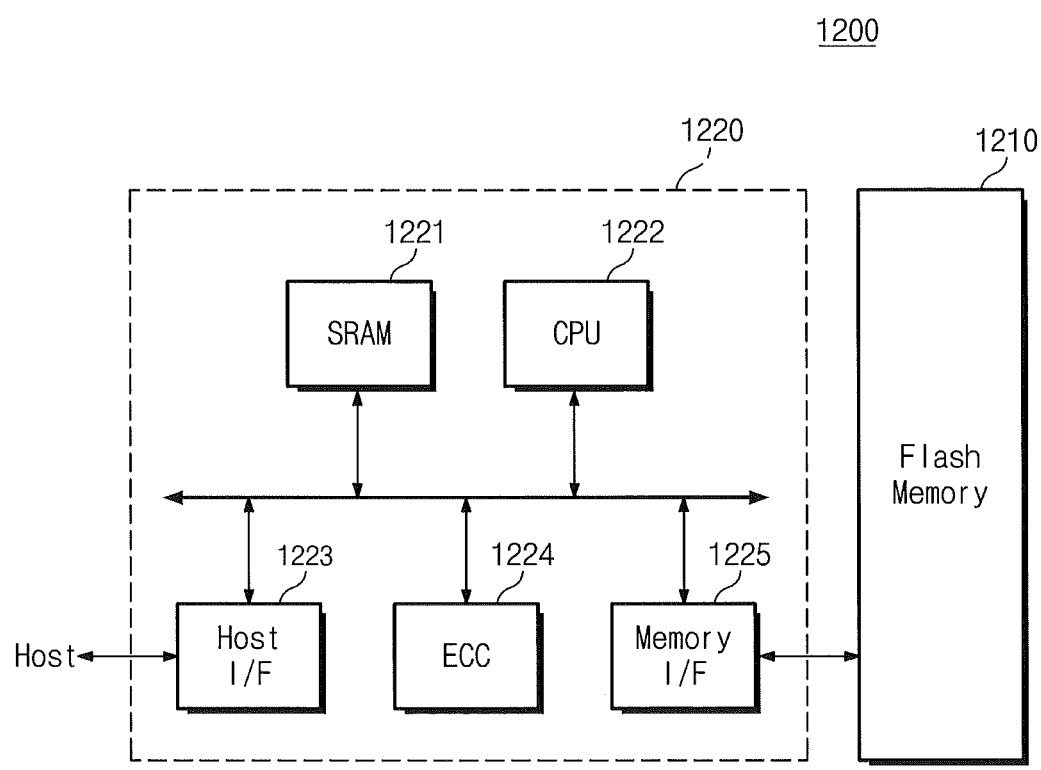
FIG. 26 is a schematic block diagram illustrating a memory card with a flash memory device according to an embodiment of the inventive concept.

FIG. 26 is a block diagram illustrating one example of a memory card 1200 including a flash memory device according to the present invention.

Referring to FIG. 26, the memory card 1200 for supporting a high capacity of data storage includes a flash memory device 1210 according to some embodiments of the inventive concept. The memory card 1200 includes a memory controller 1220 for general data exchange between a host and the flash memory device 1210.

SRAM 1221 is used as an operating memory of a central processing unit (CPU) 1222. A host interface (I/F) 1223 includes a data exchange protocol of a host connected to the memory card 1200. An error correction code (ECC) module 1224 detects and corrects an error included in data read from the multi-bit flash memory device 1210. A memory interface (I/F) 1225 may interface with the flash memory device 1210 of embodiments of the inventive concept. The CPU 1222 performs general control operations for data exchange of the memory controller 1220. Although not illustrated in the drawings, it is apparent to those skilled in the art that the memory card 1200 may further include ROM (not shown) for storing code data to interface with the host.

According to a flash memory device, a memory card, or memory system, a more reliable memory system can be provided through the flash memory device 1210 having the improved erasing characteristic of dummy cells. Especially, the flash memory device of embodiments of the inventive concept, such as a recent solid state disk (SSD), which is actively under development, may be provided in the memory system. In this case, errors caused from dummy cells can be reduced or prevented to realize a highly reliable memory system.

Figure 27:
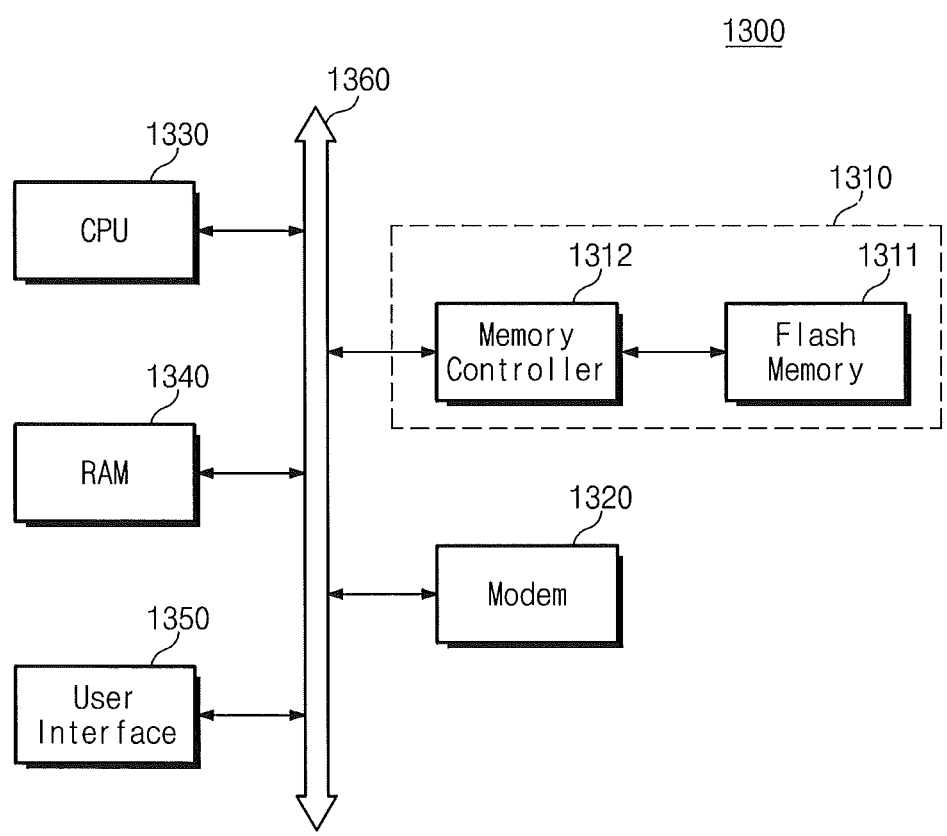
FIG. 27 is a schematic block diagram illustrating a data processing system embedded a flash memory system according to an embodiment of the inventive concept.

FIG. 27 is a block diagram illustrating an information processing system 1300 including a flash memory system 1310 according to some embodiments of the inventive concept.

Referring to FIG. 27, the flash memory system 1310 is mounted in the information processing system 1310 such as a mobile device or a desktop computer. The information processing system 1300 according to some embodiments of the inventive concept includes a modem 1320 connected to the flash memory system 1310 via a system bus 1360, CPU 1330, RAM 1340, and a user interface 1350. The flash memory system 1310 may substantially have the same configuration as the above-mentioned memory system or flash memory system. The flash memory system 1310 stores data processed by the CPU 1330 or data inputted from an external device or system. Here, the flash memory system 1310 includes a SSD. In this case, the information process system 1300 can stably store high capacity data in the flash memory system 1310. As its reliability is increased, the flash memory system 1310 may save resources consumed for an error correction process and thus provides a high speed data exchange function to the information processing system 1300. Although not illustrated in the drawing, it is apparent to those skilled in the art that the information processing system 1300 may further include an application chipset, a camera image processor (CIS), and an input/output device.

The flash memory device or the memory system according to some embodiments of the inventive concept may be mounted using various kinds of packages. Examples of the various packages include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), etc.

According to embodiments of the inventive concept, electrodes arranged three-dimensionally and interconnection structures connected to the electrodes can be formed easily.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

That which is claimed is:

1. A three-dimensional semiconductor device, comprising:
a first electrode structure disposed on a substrate, the first electrode structure having first electrodes which are stacked on the substrate; and
a second electrode structure disposed on the first electrode structure, the second electrode structure having second electrodes which are stacked on the first electrode structure;
an interconnection structure having lower plugs and being disposed on the second electrode structure;
wherein each of the first and second electrodes has a horizontal portion parallel with the substrate and an extension portion extending from the horizontal portion along a direction penetrating an upper surface of the substrate;
the horizontal portions of the first and second electrodes are gradually shortened as a distance between the first and second electrodes and the substrate increases; and
the substrate is closer to top surfaces of the extension portions of the first electrodes than to the horizontal portion of at least one of the second electrodes;
wherein the lower plugs comprise first plugs connected to the first electrodes and second plugs connected to the second electrodes, the second plugs being shorter than the first plugs.

2. The three-dimensional semiconductor device of claim 1, wherein the extension portions of the first electrodes have top surfaces that are disposed on substantially a same level;
the extension portions of the second electrodes have top surfaces that are formed on substantially a same level; and
the extension portions of the first electrodes are formed on a different level from the extension portions of the second electrodes.

3. The three-dimensional semiconductor device of claim 1, wherein a difference in length between the first plugs and the second plugs is about a difference in height between top surfaces of the first and second electrode structures.

4. The three-dimensional semiconductor device of claim 1, wherein the interconnection structure comprises:
lower interconnection lines crossing over the horizontal portions and connected to the first and second plugs;
at least one upper plug connected to the lower interconnection line; and
at least one upper interconnection line connected to the upper plug.

5. The three-dimensional semiconductor device of claim 4, wherein the lower interconnection lines connected to the first and second plugs are disposed on substantially a same level.

6. The three-dimensional semiconductor device of claim 1, further comprising:
first semiconductor patterns penetrating the first electrode structure, the first semiconductor patterns being two dimensionally arranged;
second semiconductor patterns penetrating the second electrode structure, each of the second semiconductor patterns being disposed on each of the first semiconductor patterns, respectively;
at least one first information storage element disposed between sidewalls of the first semiconductor patterns and the first electrodes; and
at least one second information storage element disposed between sidewalls of the second semiconductor patterns and the second electrodes.

7. The three-dimensional semiconductor device of claim 6, wherein the at least one first information storage element is extended from the sidewall of one of the first electrodes to cover a top surface and a bottom surface of the one of the first electrodes.

8. The three-dimensional semiconductor device of claim 6, wherein one of the at least one first and second information storage elements covers a top surface of the extension portion of at least one of the first and second electrodes with which the at least one of the first and second information storage elements is in contact.

9. The three-dimensional semiconductor device of claim 1, wherein for two adjacent electrodes selected from the first and second electrodes, a vertical distance between horizontal portions of the two adjacent electrodes is different from a horizontal distance between extension portions of the two adjacent electrodes.

10. The three-dimensional semiconductor device of claim 9, further comprising:
   first interlayer mold layers disposed between the first electrodes;
   second interlayer mold layers disposed between the second electrodes; and
   an insulating spacer disposed on at least one sidewall of the extension portion of at least one of the first and second electrodes.

11. The three-dimensional semiconductor device of claim 1, wherein for at least one of the first and second electrodes, a width of the corresponding extension portion is greater than a thickness of the corresponding horizontal portion.

12. The three-dimensional semiconductor device of claim 1, wherein at least one of the extensions of the first and second electrodes has a major axis that is sloped with respect to a normal line to a top surface of the substrate.

13. A three-dimensional semiconductor device, comprising:
   a first electrode structure disposed on a substrate, the first electrode structure having first electrodes which are stacked on the substrate; and
   a second electrode structure disposed on the first electrode structure, the second electrode structure having second electrodes which are stacked on the first electrode structure;
   a first outer mold and a second outer mold, which are sequentially stacked on the substrate;
   wherein each of the first and second electrodes has a horizontal portion parallel with the substrate and an extension portion extending from the horizontal portion along a direction penetrating an upper surface of the substrate;
   the horizontal portions of the first and second electrodes are gradually shortened as a distance between the first and second electrodes and the substrate increases; and
   the substrate is closer to top surfaces of the extension portions of the first electrodes than to the horizontal portion of at least one of the second electrodes;
   wherein a sidewall of the first electrode structure is defined by the first outer mold, a sidewall of the second electrode structure is defined by the second outer mold, and the second outer mold covers top surfaces of the extension portions of the first electrodes.

* * * * *